(12) United States Patent
Shikina et al.

(10) Patent No.: US 11,716,550 B2
(45) Date of Patent: Aug. 1, 2023

(54) IMAGING APPARATUSES, SYSTEMS, AND MOVING IMAGING OBJECTS

(71) Applicant: CANON KABUSHIKI KAISHA, Tokyo (JP)

(72) Inventors: Noriyuki Shikina, Hachioji (JP); Kentaro Tsukida, Yokohama (JP); Yasushi Iwakura, Kawaguchi (JP); Yoichi Wada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/712,813

(22) Filed: Dec. 12, 2019

(65) Prior Publication Data
US 2020/0120297 A1    Apr. 16, 2020

Related U.S. Application Data

(63) Continuation of application No. 15/717,734, filed on Sep. 27, 2017, now Pat. No. 10,547,803.

(30) Foreign Application Priority Data

Sep. 30, 2016 (JP) ................................ 2016-193123
Jul. 27, 2017 (JP) ................................ 2017-145583

(51) Int. Cl.
*H04N 7/18* (2006.01)
*H04N 25/671* (2023.01)
(Continued)

(52) U.S. Cl.
CPC ..... *H04N 25/671* (2023.01); *H01L 27/14603* (2013.01); *H01L 27/14612* (2013.01);
(Continued)

(58) Field of Classification Search
CPC .................................................... H04N 5/3651
(Continued)

(56) References Cited

U.S. PATENT DOCUMENTS 5,469,484 A * 11/1995 Sato ......................... H03K 5/15
                                                                257/233
5,521,639 A * 5/1996 Tomura ............. H01L 27/14831
                                                                348/E5.081
(Continued)

FOREIGN PATENT DOCUMENTS

CN         101171835 A        4/2008
CN         102007762 A        4/2011
(Continued)

*Primary Examiner* — Leron Beck
(74) *Attorney, Agent, or Firm* — Canon U.S.A., Inc. I.P. Division

(57) ABSTRACT

An imaging arrangement comprising: a plurality of pixels arranged in a matrix; and a signal processing arrangement. A first and a second line of the matrix each comprise a light-receiving pixel and a reference pixel, the light-receiving pixels each receive incident light and output a light signal based on the incident light, and each reference pixel outputs a pixel signal for forming an address signal. The processing arrangement provides a first address signal and a second address signal, wherein: the first address signal indicates the position of the first line and comprises a signal value based on the pixel signal from the first line; and the second address signal indicates the position of the second line and comprises a signal value based on the pixel signal from the second line; and the signal value of the first address signal is different to the signal value of the second address signal.

21 Claims, 16 Drawing Sheets

(51) Int. Cl.
*H04N 17/00* (2006.01)
*H01L 27/146* (2006.01)
*H04N 25/75* (2023.01)
*H04N 25/63* (2023.01)
*H04N 25/683* (2023.01)

(52) U.S. Cl.
CPC ..... *H01L 27/14623* (2013.01); *H04N 17/002* (2013.01); *H04N 25/75* (2023.01); *H04N 25/63* (2023.01); *H04N 25/683* (2023.01)

(58) Field of Classification Search
USPC ........................................ 375/240.01–240.29
See application file for complete search history.

(56) References Cited

U.S. PATENT DOCUMENTS

| | | | | |
|---|---|---|---|---|
| 5,847,381 A * | 12/1998 | Isogai | ............... | H01L 27/14643 257/292 |
| 6,133,862 A * | 10/2000 | Dhuse | ................... | H04N 5/374 341/118 |
| 9,270,905 B2 * | 2/2016 | Ogura | ................... | H04N 5/378 |
| 2002/0018133 A1 | 2/2002 | Mendis | | |
| 2004/0169750 A1 * | 9/2004 | Miyahara | ............. | H04N 5/3595 348/E5.081 |
| 2004/0235215 A1 * | 11/2004 | Komori | ............ | H01L 27/14612 438/57 |
| 2005/0055387 A1 * | 3/2005 | Kuekes | ............. | G11C 13/0014 708/1 |
| 2007/0019088 A1 | 1/2007 | Saito | | |
| 2008/0083876 A1 * | 4/2008 | Endo | ................... | H04N 5/378 348/E5.079 |
| 2009/0033782 A1 * | 2/2009 | Muroshima | ............ | H04N 5/378 348/308 |
| 2009/0079849 A1 * | 3/2009 | Kondo | ................... | H04N 5/374 348/231.99 |
| 2009/0160979 A1 * | 6/2009 | Xu | ........................ | H04N 5/361 348/E5.081 |
| 2009/0213253 A1 * | 8/2009 | Fukuoka | ................ | H04N 5/359 348/294 |
| 2010/0110248 A1 * | 5/2010 | Chou | .................... | H04N 5/378 348/E3.016 |
| 2010/0157120 A1 * | 6/2010 | Compton | ............... | H04N 5/376 348/E5.022 |
| 2011/0006809 A1 * | 1/2011 | Takenaka | ........... | H03K 3/35613 327/333 |
| 2011/0013033 A1 * | 1/2011 | Mori | ..................... | H04N 5/378 348/220.1 |
| 2011/0155890 A1 * | 6/2011 | Egawa | ................ | H04N 5/3575 250/208.1 |
| 2012/0119063 A1 * | 5/2012 | Takamiya | .............. | H04N 5/378 250/208.1 |
| 2012/0292485 A1 * | 11/2012 | Kasuga | ................ | H04N 5/3575 250/208.1 |
| 2012/0305752 A1 * | 12/2012 | Shimizu | ............... | H04N 5/3765 250/208.1 |
| 2013/0001399 A1 * | 1/2013 | Egawa | ................... | H04N 5/378 250/208.1 |
| 2014/0077063 A1 * | 3/2014 | Cho | ........................ | H04N 5/379 257/443 |
| 2015/0303232 A1 | 10/2015 | Yamazaki | | |
| 2016/0037106 A1 * | 2/2016 | Ohmaru | ............... | H04N 5/3698 348/143 |
| 2018/0226441 A1 * | 8/2018 | Kondo | ............. | H01L 27/14634 |

FOREIGN PATENT DOCUMENTS

| | | |
|---|---|---|
| CN | 102771114 A | 11/2012 |
| EP | 1082701 A1 | 3/2001 |
| JP | 2002290841 A | 10/2002 |
| JP | 2007-505436 A | 3/2007 |
| KR | 10-0815555 B1 | 3/2008 |

* cited by examiner

FIG.4

| | | FIRST SET | | | | SECOND SET | | | | THIRD SET | | | |
|---|---|---|---|---|---|---|---|---|---|---|---|---|---|
| COLUMN NUMBER | 0 | 1 | 2 | 3 | 4 | 5 | 6 | 7 | 8 | 9 | 10 | 11 | |
| ZEROTH ROW — D(0,0) | 0 | 0 | 0 | 0 | 0 | 0 | 0 | 0 | 0 | 0 | 0 | 0 | |
| FIRST ROW | 0 | 0 | 0 | 1 | 0 | 0 | 0 | 1 | 0 | 0 | 0 | 1 | — 307 |
| SECOND ROW | 0 | 0 | 1 | 0 | 0 | 0 | 1 | 0 | 0 | 0 | 1 | 0 | — D(2,11) |
| ... | ... | ... | ... | ... | ... | ... | ... | ... | ... | ... | ... | ... | |
| SIXTEENTH ROW | 1 | 1 | 1 | 1 | 1 | 1 | 1 | 1 | 1 | 1 | 1 | 1 | — D(16,11) |

IMAGING APPARATUSES, SYSTEMS, AND MOVING IMAGING OBJECTS

CROSS-REFERENCE TO RELATED APPLICATIONS

This application is a continuation, and claims the benefit, of U.S. patent application Ser. No. 15/717,734 filed Sep. 27, 2017 (now issued as U.S. Pat. No. 10,547,803), and claims the benefit of, and priority to, Japanese Patent Application No. 2016-193123 filed Sep. 30, 2016, and Japanese Patent Application No. 2017-145583 filed Jul. 27, 2017, which applications are hereby incorporated by reference herein in their entireties.

BACKGROUND OF THE INVENTION

Field of the Invention

The present invention relates to imaging apparatuses, imaging systems, moving objects, and methods for operating such systems.

Description of the Related Art

An imaging apparatus discussed in Japanese Patent Application Laid-Open No. 2009-118427 includes an effective pixel area and a non-effective pixel area. The effective pixel region is arranged to receive external light and is used for capturing an image. Pixels arranged in the effective pixel area each include a photodiode that generates an electric signal by a photoelectric conversion. On the other hand, an entire surface of the non-effective pixel area is covered with a light-shielding film. The non-effective pixel area includes a reference area and a failure-detection pattern area. Pixels arranged in the reference area generate a signal to be used as a reference for an image signal level. Pixels each equipped with a photodiode (pixels with photodiode (PD)) and pixels each unequipped with a photodiode (pixels without PD) are arranged in the failure-detection pattern area. Signals according to a pattern in which these pixels with PD and pixels without PD are arranged are acquired from the failure-detection pattern area. A failure is determined based on these signals.

SUMMARY OF THE INVENTION

An imaging apparatus as an exemplary embodiment according to one aspect of the present invention includes a plurality of pixels arranged in a matrix including at least a first row and a second row, wherein each of the first row and the second row contains a light-receiving pixel and a reference pixel, the light-receiving pixel being configured to receive incident light and output a pixel signal based on the incident light, and the reference pixel being configured to output a pixel signal for forming an address signal indicating a position of the row to which the reference pixel belongs, and wherein a signal value of the address signal output from the first row and a signal value of the address signal output from the second row are different from each other.

An imaging apparatus as an exemplary embodiment according to another aspect of the present invention includes a plurality of pixels arranged in a matrix including at least a first column and a second column, wherein each of the first column and the second column contains a light-receiving pixel and a reference pixel, the light-receiving pixel being configured to receive incident light and output a pixel signal based on the incident light, and the reference pixel being configured to output a pixel signal for forming an address signal indicating a position of the column to which the reference pixel belongs, and wherein a signal value of the address signal output from the first column and a signal value of the address signal output from the second column are different from each other.

An imaging apparatus as an exemplary embodiment according to yet another aspect of the present invention includes a plurality of pixels at least including a first light-receiving pixel and a second light-receiving pixel, each light-receiving pixel being configured to receive incident light and output a pixel signal based on the incident light, a first reference pixel arranged to provide a pixel signal in parallel with the pixel signal from the first light-receiving pixel, and a second reference pixel arranged to provide a pixel signal in parallel with the pixel signal from the second light-receiving pixel, and an output control circuit configured to control a level of the pixel signal from each of the first reference pixel and the second reference pixel so that the pixel signal provided by the first reference pixel and the pixel signal provided by the second reference pixel have different levels.

An imaging system as an exemplary embodiment according to yet another aspect of the present invention includes a signal processing unit configured to process a pixel signal output from a light-receiving pixel of the imaging apparatus and provide an image signal based on the pixel signal, wherein the signal processing unit receives a plurality of address signals output from the imaging apparatus, the plurality of address signals having different signal values, and wherein the signal processing unit determines whether the pixel signal of the light-receiving pixel is normally output from the imaging apparatus, based on the plurality of address signals.

Further features of the present invention will become apparent from the following description of exemplary embodiments with reference to the attached drawings.

BRIEF DESCRIPTION OF THE DRAWINGS

FIG. 4 schematically illustrates an address signal output from the imaging apparatus.

FIG. 9 schematically illustrates an address signal output from an imaging apparatus.

FIG. 10 schematically illustrates the address signal output from the imaging apparatus.

DESCRIPTION OF THE EMBODIMENTS

Figure 1:
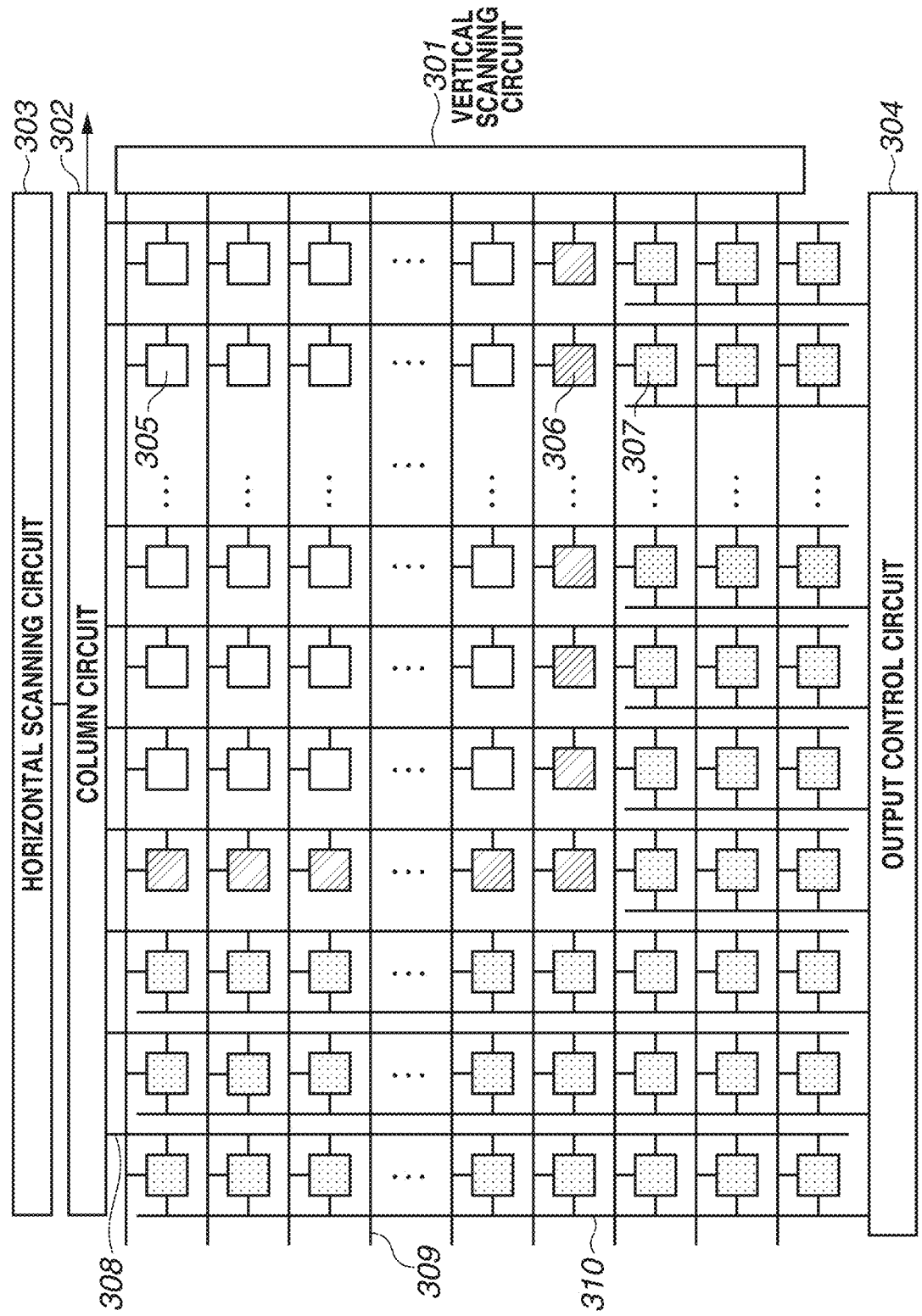
FIG. 1 schematically illustrates an entire configuration of an imaging apparatus.

According to several exemplary embodiments, a failure can be correctly detected.

According to the technique discussed in Japanese Patent Application Laid-Open No. 2009-118427, it is determined whether the signals acquired from the failure-detection pattern area match a predetermined pattern. However, this method has a problem of being unable to correctly detect a failure and a malfunction of the imaging apparatus. For example, a pixel signal may be unable to be normally read out from a specified pixel in the effective pixel area due to a failure in a driving circuit of the imaging apparatus. On the other hand, when the pixels in the failure-detection pattern area are normal, the signals acquired from the failure-detection pattern area indicate that the imaging operation normally operates. In other words, despite the occurrence of the failure in the imaging apparatus, this failure may be unable to be detected.

One exemplary embodiment according to the present invention is an imaging apparatus. The imaging apparatus includes a plurality of pixels arranged so as to form a matrix. The plurality of pixels includes a light-receiving pixel and a reference pixel. External light is incident on the light-receiving pixel from outside. The light-receiving pixel outputs a pixel signal according to the incident light—i.e. the light-receiving pixel is arranged to provide a light signal in response to receiving light. The reference pixel outputs a pixel signal for forming an address signal.

The address signal contains information regarding a position of a row or a column. Address signals having different signal values are assigned to at least two rows or two columns. One address signal is formed by a pixel signal from one reference pixel or pixel signals from a plurality of reference pixels. Thus, for example, at least a first address signal is generated based on the pixel signals from a first row/column of the matrix, and a second address signal is generated based on the pixel signals from a second row/column of the matrix. In this way, the first address signal is associated with the first row, and the second address signal is associated with the second row.

In an exemplary embodiment in which an address signal is formed by a pixel signal from a reference pixel, at least one reference pixel is disposed for each row. Reference pixels in different rows output a plurality of pixel signals at levels different from each other or one another. The level means a current value or a voltage value of the pixel signal. The level of the pixel signal of the reference pixel indicates a signal value of the address signal. That is, a signal value of an address signal may be based on the pixel signal—e.g. a signal value of an address signal may correspond to the level(s) of one or more pixel signals. In one example, one reference pixel is disposed in each row, and a reference pixel in an odd-numbered row outputs a high-level pixel signal while a reference pixel in an even-numbered row outputs a low-level pixel signal. By this configuration, for example, it can be determined whether the imaging apparatus reads out the signal in the even-numbered row or reads out the signal in the odd-numbered row. Alternatively, the reference pixel for each row outputs a pixel signal at a level unique to the row to which the reference pixel belongs. In a case where the imaging apparatus includes pixels of 4000 rows, the reference pixels output pixel signals at 4000 levels. By this configuration, it can be determined, for example, from which row the imaging apparatus reads out the signal.

In another exemplary embodiment, a plurality of reference pixels is disposed for each row. In this exemplary embodiment, one address signal is formed by the pixel signals from the plurality of reference pixels. For example, each of the reference pixels outputs the high-level pixel signal or the low-level pixel signal. In a case where N reference pixels are disposed, an address signal is formed as an N-bit digital signal based on a combination of the high-level pixel signal and the low-level pixel signal. The high-level pixel signal corresponds to "1" in each bit, and the low-level pixel signal corresponds to "0" in each bit. In this case, a pattern of the digital signal in which 0 and 1 are arranged indicates the signal value of the address signal. Providing 12 reference pixels allows an address signal having a unique signal value to be generated for each of 4096 rows. The unique address signal does not have to be generated for each of all of the rows. The number of the reference pixels contained in each row for the pixels in the 4096 rows may be less than 12 reference pixels. In this case, the address signal having the same signal value is assigned to a plurality of rows.

In each of the above-described exemplary embodiments, each reference pixel may output at least two pixel signals at different levels. Alternatively, each of the above-described exemplary embodiments may be configured in such a manner that each reference pixel outputs only a pixel signal at one level. Further, the imaging apparatus in which each row contains the reference pixel has been cited as an example in the above description, but the exemplary embodiments can also be applied to an imaging apparatus in which each column contains the reference pixel by replacing the term "row" with the term "column" in the present disclosure.

One exemplary embodiment according to the present invention is an imaging system. The imaging system includes a signal processing unit that processes a pixel signal output from an imaging apparatus to acquire an image signal. The signal processing unit further receives an address signal output from the imaging apparatus and determines whether the pixel signal is normally output from the imaging apparatus. The address signal may be any of the address signals described herein—e.g. it may be the same as the address signal described in the above-described exemplary embodiments regarding the imaging apparatus. Using the methods described herein can detect, for example, a defect of a read-out circuit(s) which provides control signals to read-out the pixel signal(s). This allows the determination of whether a pixel signal is normally output from the light-receiving pixel to be performed more accurately.

In one exemplary embodiment, the signal processing unit determines whether the pixel signals of a plurality of rows are output in a predetermined order. The signal processing unit determines whether a plurality of address signals sequentially output along with the readout of the pixel signals of the plurality of rows changes as expected. For example, in the case where the address signals having the different signal values are assigned to the odd-numbered row and the even-numbered row, the signal processing unit determines whether these address signals having the different signal values are alternately output. By this configuration, it can be determined whether the pixel signals of the plurality of rows are output in the predetermined order.

Alternatively, the signal processing unit determines whether the pixel signal in a specified row is appropriately output. The signal processing unit determines whether the signal value of the address signal output together with the pixel signal matches the signal value assigned to the specified row—i.e. whether they match the signal value(s) that the reference pixel(s) in a specified row were set to provide. By this configuration, it can be determined whether the pixel signal in a predetermined row is normally output.

In the present exemplary embodiment, it is determined that the imaging apparatus normally operates or normally outputs a signal while an address signal outputs an expected signal value. If a signal value of an address signal is different from the expected signal value, the signal processing unit determines that the imaging apparatus does not normally operate or a failure has occurred in the imaging apparatus. Thus, for example, a determination as to whether a light-signal is output normally can be made based on whether a signal value of an address signal matches and expected signal value (i.e. a signal value corresponding to a pixel signal which a reference pixel was set to provide).

In the present exemplary embodiment, the signal processing unit provided outside the imaging apparatus determines whether the imaging apparatus normally outputs the pixel signal. On the other hand, in an exemplary embodiment of the imaging apparatus, a circuit provided inside the imaging apparatus may determine whether the signal is normally output. Thus, the determination may be made by a processing arrangement located within an imaging apparatus or external to an imaging apparatus.

The above-described imaging apparatus and imaging system are used for a camera, a monitoring apparatus, a robot, and the like. Alternatively, the above-described imaging apparatus and imaging system are used for a moving object. Especially for a moving object for transporting a human, such as a vehicle, an airplane, and a ship, it is desirable that an apparatus mounted thereon is highly reliable. Thus, it will be appreciated that the term moving object is a movable object such as an automobile, boat, airplane, bicycle, or other type of vehicle or robot. Preferably, the moving object may be an autonomous vehicle. More generally, the moving object may also be, for example, a vehicle for transporting goods or people. According to the imaging apparatus and the imaging system of the above-described exemplary embodiments, it can be determined whether the pixel signal is normally output from the imaging apparatus. Therefore, if a failure has occurred in the imaging apparatus, an imaging operation can be stopped and/or a warning can be issued to indicate the occurrence of the failure.

In several exemplary embodiments, the imaging apparatus or the imaging system includes a unit configured to detect an abnormality in the reference pixel. More specifically, when a signal value of an address signal output from the reference pixel does not match the expected signal value, it is determined whether this mismatch is caused by an abnormality or a failure in the reference pixel or this mismatch indicates that the signal is read out from a light-receiving pixel that is not actually intended. Such means can further improve the reliability of the imaging apparatus or the imaging system, or the moving object using them.

In the following description, the exemplary embodiments of the present invention will be described in detail with reference to the drawings. The present invention is not limited only to the exemplary embodiments that will be described below. The exemplary embodiments of the present invention also include a modification in which a part of configurations of the exemplary embodiments that will be described below is changed within a range that does not depart from the spirit of the present invention. Further, the exemplary embodiments of the present invention also include an example in which a part of the configuration of any of the following exemplary embodiments is added to another exemplary embodiment or is replaced with a part of the configuration of another exemplary embodiment.

A first exemplary embodiment will be described. FIG. 1 schematically illustrates a configuration of an imaging apparatus according to the first exemplary embodiment. The imaging apparatus includes a plurality of pixels 305, 306, and 307 arranged so as to form a matrix. The plurality of pixels includes a light-receiving pixel as the pixel 305, an optical black pixel (hereinafter referred to as an OB pixel) as the pixel 306, and a reference pixel as the pixel 307. The imaging apparatus further includes a vertical scanning circuit 301, a column circuit 302, a horizontal scanning circuit 303, an output control circuit 304, output lines 308, driving control lines 309, and output control lines 310.

The plurality of pixels 305, 306, and 307 contained in one row is connected to the common driving control line 309. The vertical scanning circuit 301 supplies a driving signal to each of the plurality of pixels 305, 306, and 307 via the driving control line 309. A pixel signal is output in parallel with the output line 308 from each of the plurality of pixels 305, 306, and 307 contained in one row based on the driving signal. The plurality of pixels 305, 306, and 307 contained in one column is connected to the common output line 308. The pixel signal output to the output line 308 is input to the column circuit 302. One column circuit 302 is disposed for the individual output lines 308. The column circuit 302 performs an operation such as an amplification of the pixel signal, a conversion from an analog signal to a digital signal on the pixel signal, retention of the pixel signal, and removal of noise in the pixel signal. The pixel signal is sequentially read out from the column circuit 302 by the horizontal scanning circuit 303.

The light-receiving pixel 305 is configured to receive light from outside. The light-receiving pixel 305 outputs a pixel signal according to the incident light. The OB pixel 306 is covered with a not-illustrated light-shielding film. The light-shielding film is disposed so as to expose the light-receiving pixel 305. The OB pixel 306 outputs a pixel signal at a level corresponding to a state in which no light is incident, i.e., at a dark level. The pixel signal output from the OB pixel 306 can contain a noise component different for each pixel. Therefore, the pixel signal output from the OB pixel 306 may be different according to a position. However, an amount of the noise component depends on, for example, a variation in manufacturing and thermal noise, and therefore is random. Therefore, the pixel signal from the OB pixel 306 is not information for identifying a position of the row or the column.

The reference pixel 307 outputs a pixel signal for forming an address signal. Any of the above-described address signals is used in the present exemplary embodiment. In the present exemplary embodiment, the output control circuit 304 controls a level of the output signal output from the reference pixel 307. More specifically, the output control circuit 304 supplies a predetermined voltage to the output control line 310. The reference pixel 307 outputs a pixel signal at a level according to the voltage of the output control line 310. The reference pixel 307 may be covered with the not-illustrated light-shielding film. Alternatively, the reference pixel 307 may be exposed because the reference pixel 307 does not include a photodiode.

Figure 2B:
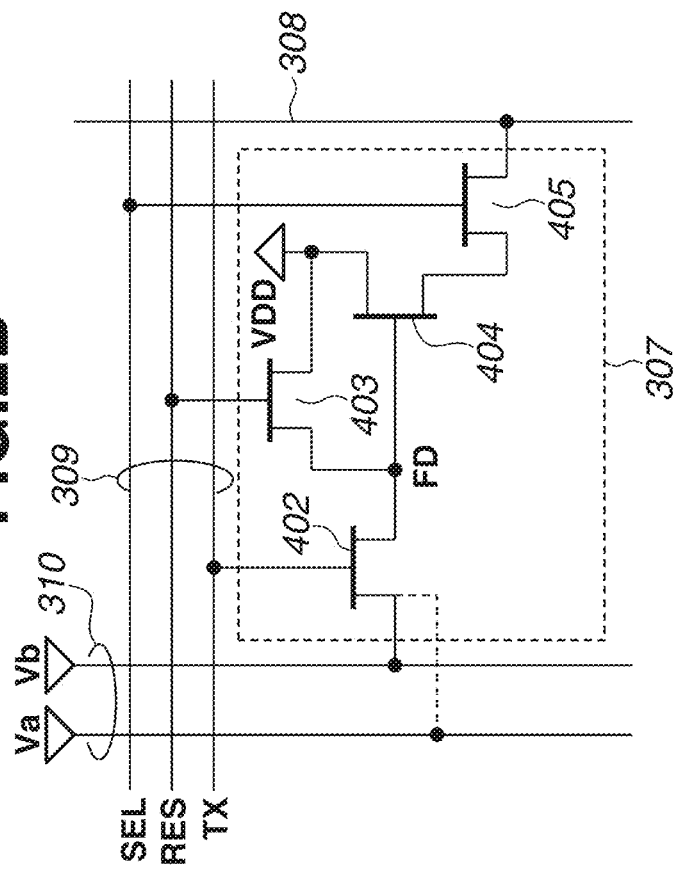
FIGS. 2A and 2B each illustrate an equivalent circuit of a pixel of the imaging apparatus.
Figure 2A:
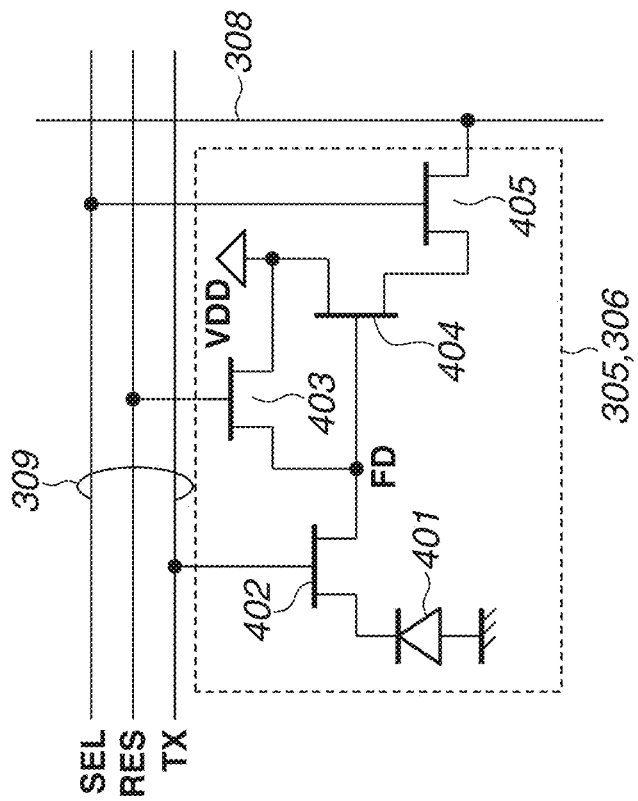

Subsequently, a configuration of each of the light-receiving pixel 305, the OB pixel 306, and the reference pixel 307 will be described. FIG. 2A illustrates an equivalent circuit of each of the light-receiving pixel 305 and the OB pixel 306. FIG. 2B illustrates an equivalent circuit of the reference pixel 307.

As illustrated in FIG. 2A, the light-receiving pixel 305 and the OB pixel 306 each include a photodiode (hereinafter referred to as a PD) 401. The PD 401 converts incident light into a charge by a photoelectric conversion. In other words, the PD 401 is one example of a photoelectric conversion unit. Since the external light is incident on the PD 401 of the light-receiving pixel 305, charges generated from the photoelectric conversion are accumulated in the PD 401 of the light-receiving pixel 305. On the other hand, the PD 401 of the OB pixel 306 is shielded from the light. Therefore, charges that can become noise, such as a dark current, are accumulated in the PD 401 of the OB pixel 306. The PD 401 of the OB pixel 306 may be omitted.

As illustrated in FIG. 2B, the reference pixel 307 does not include the PD 401. Instead thereof, the reference pixel 307 is connected to the output control lines 310. In the present exemplary embodiment, the output control line 310 that supplies a voltage Va, and the output control line 310 that supplies a voltage Vb different from the voltage Va are connected to the reference pixel 307. The output control circuit 304 selects one of the two output control lines 310 to supply the voltage thereto. By such a configuration, the reference pixel 307 can selectively output a pixel signal at a level corresponding to the voltage Va and a pixel signal at a level corresponding to the voltage Vb. In the case where the reference pixel 307 does not output the plurality of pixel signals at the different levels, the reference pixel 307 only has to be connected to just any one of the output control line 310 that supplies the voltage Va and the output control line 310 that supplies the voltage Vb.

The light-receiving pixel 305, the OB pixel 306, and the reference pixel 307 each include a transfer transistor 402. The transfer transistor 402 of each of the light-receiving pixel 305 and the OB pixel 306 transfers the charge in the PD 401 to a floating diffusion (FD) node. On the other hand, the transfer transistor 402 of the reference pixel 307 transmits the voltage Va or the voltage Vb to the FD node. A gate of the transfer transistor 402 is connected to the driving control line 309 that supplies a driving signal TX. The transfer transistor 402 is controlled by the driving signal TX.

The light-receiving pixel 305, the OB pixel 306, and the reference pixel 307 each include an amplification transistor 404. The FD node is connected to a gate of the amplification transistor 404. The amplification transistor 404 outputs a pixel signal based on the voltage of the FD node to the output line 308. For example, the amplification transistor 404 and a not-illustrated current source connected to the output line 308 form a source follower circuit.

The light-receiving pixel 305, the OB pixel 306, and the reference pixel 307 each include a reset transistor 403. The reset transistor 403 resets the voltage of the FD node. A drain of the reset transistor 403 is connected to a node that supplies a reset voltage Vres. In the present exemplary embodiment, a power source voltage VDD is used as the reset voltage Vres. A gate of the reset transistor 403 is connected to the driving control line 309 that supplies a driving signal RES. The reset transistor 403 is controlled to be turned on and off by the driving signal RES.

The light-receiving pixel 305, the OB pixel 306, and the reference pixel 307 each include a selection transistor 405. The selection transistor 405 is disposed in an electric path between the amplification transistor 404 and the output line 308. A gate of the selection transistor 405 is electrically connected to the driving control line 309 that supplies a driving signal SEL. The selection transistor 405 is controlled to be turned on and off according to the driving signal SEL. When the selection transistor 405 is turned on, the pixel signal is output from the corresponding amplification transistor 404 to the output line 308. A pixel that outputs a pixel signal is selected by turning on the selection transistor 405 of some of pixels among the plurality of pixels connected to one output line 308 and turning off the selection transistors 405 of the rest of pixels among them. Two or more pixels connected to one output line 308 may be selected at the same time.

By such a configuration, the light-receiving pixel 305 can output the pixel signal according to the incident light. The OB pixel 306 can output the pixel signal at the dark level. Further, the reference pixel 307 selectively outputs the pixel signal at the level corresponding to the voltage Va and the pixel signal at the level corresponding to the voltage Vb.

Figure 13:
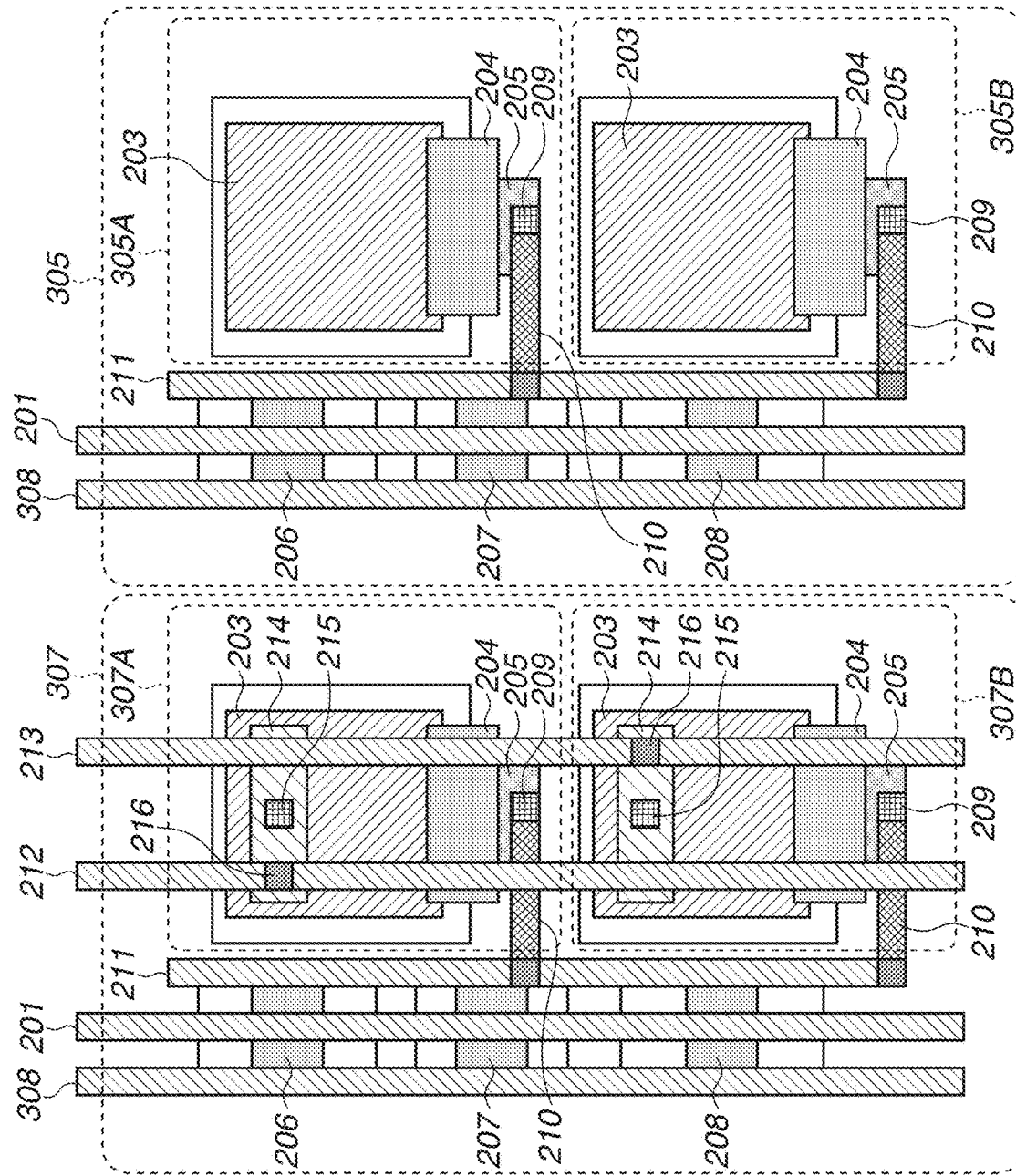
FIG. 13 schematically illustrates a planar configuration of the pixel of the imaging apparatus.

The configuration of each of the light-receiving pixel 305 and the reference pixel 307 will be described in detail. FIG. 13 schematically illustrates a planar configuration of each of the light-receiving pixel 305 and the reference pixel 307 of the imaging apparatus. In FIG. 13, the same reference numerals as the reference numerals used in FIGS. 2A and 2B are also used to indicate members having the same functions as the members illustrated in FIGS. 2A and 2B.

A power source wiring 201 is a wiring that transmits a power source voltage VDD to the pixel for image acquisition. The light-receiving pixel 305 includes a semiconductor region 203, which is a part of the PD 401. The semiconductor region 203 is a charge accumulation portion where the charges generated from the photoelectric conversion are accumulated. In the present example, a conductivity type of the semiconductor region 203 is assumed to be the n-type. Further, the charges accumulated in the semiconductor region 203 are assumed to be electrons.

The light-receiving pixel 305 includes a transfer gate 204 of the transfer transistor 402, and a floating diffusion region 205, which is a part of the FD node. FIG. 13 illustrates a configuration in which two light-receiving pixels 305 share one amplification transistor 404 therebetween. Therefore, FIG. 13 illustrates a pair of the semiconductor region 203 and the floating diffusion region 205 included in a first light-receiving pixel 305A, and a pair of the semiconductor region 203 and the floating diffusion region 205 included in a second light-receiving pixel 305B.

The light-receiving pixel 305 includes a gate 206 of the selection transistor 405 (a selection gate), a gate (amplification gate) 207 of the amplification transistor 404, and a gate 208 of the reset transistor 403 (a reset gate). Further, the light-receiving pixel 305 includes an FD connection contact 209, a first FD connection wiring 210, and a second FD connection wiring 211. Hereinafter, the contact will be referred to as a CNT.

The semiconductor region 203 is connected to the floating diffusion region 205 via the transfer gate 204. The charges accumulated in the semiconductor region 203 are transferred to the floating diffusion region 205 via the transfer gate 204. The floating diffusion region 205 is connected to the amplification gate 207 via the FD connection CNT 209 and the FD connection wirings 210 and 211.

The floating diffusion region 205 is connected to the reset transistor 403 via the FD connection CNT 209 and the FD connection wirings 210 and 211.

A part of the configuration of the reference pixel 307 is similar to the light-receiving pixel 305. Portions in the similar configuration to the light-receiving pixel 305 are indicated by the same reference numerals as the light-receiving pixel 305. Redundant descriptions will be omitted here. FIG. 13 illustrates a configuration in which two reference pixels 307 share one amplification transistor 404 therebetween. Therefore, FIG. 13 illustrates a pair of the semiconductor region 203 and the floating diffusion region 205 included in a first reference pixel 307A and a pair of the semiconductor region 203 and the floating diffusion region 205 included in a second reference pixel 307B.

The semiconductor region 203 forming the PD 401 in the reference pixel 307 is connected to a first voltage supply line 212 or a second voltage supply line 213. The first voltage supply line 212 or the second voltage supply line 213 is a wiring forming the output control line 310. The connection between the semiconductor region 203 and the first voltage supply line 212 or the second voltage supply line 213 is established via a CNT 215, a wiring 214, and a via 216. The via 216 connects the voltage supply line 212 or 213 and the wiring 214 to each other.

The first voltage supply line 212 and the voltage supply line 213 are disposed above the PD 401 in the reference pixel 307. In other words, the first voltage supply line 212 and the PD 401 overlap each other and the second voltage supply line 213 and the PD 401 overlap each other in a planar view in terms of a light-receiving surface.

In the reference pixel 307, a potential applied to the semiconductor region 203 via the first voltage supply line 212 or the second voltage supply line 213 is output to the floating diffusion region 205 via the transfer transistor 402.

Figure 14:
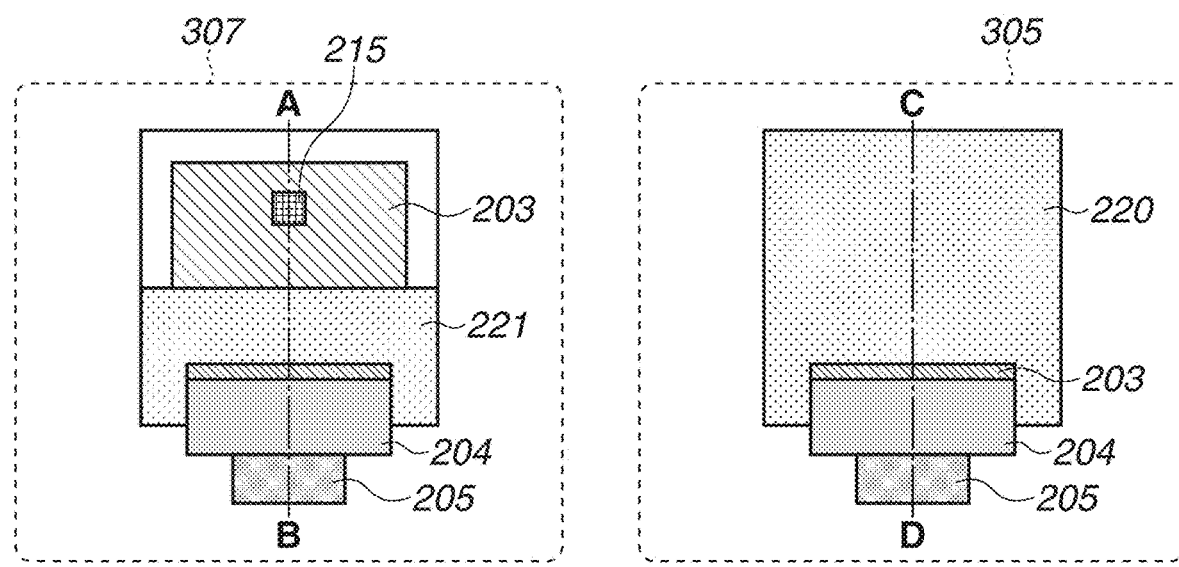
FIG. 14 schematically illustrates a planar configuration of the pixel of the imaging apparatus.

The configuration of each of the light-receiving pixel 305 and the reference pixel 307 described with reference to FIG. 13 will be further described, focusing on the PD 401 with reference to FIG. 14. FIG. 14 illustrates the light-receiving pixel 305, the PD 401 in the reference pixel 307, and the transfer transistor 402. In FIG. 14, the same reference numerals as the reference numerals used in FIG. 13 are also used to indicate the same members as the members illustrated in FIG. 13.

First, the light-receiving pixel 305 will be described. The semiconductor region 203 where the charges are accumulated overlaps a p-type semiconductor region 220 in a planar view. As will be described below with reference to FIGS. 15A and 15B, the p-type semiconductor region 220 functions as a surface protective layer that protects a surface of the semiconductor region 203. Hereinafter, the semiconductor region 220 may be referred to as the surface protective layer.

Next, the reference pixel 307 will be described. A p-type semiconductor region 221 is provided between a portion of the semiconductor region 203 to which the CNT 215 is connected, and the transfer gate 204 in the planar view.

Figure 15A:
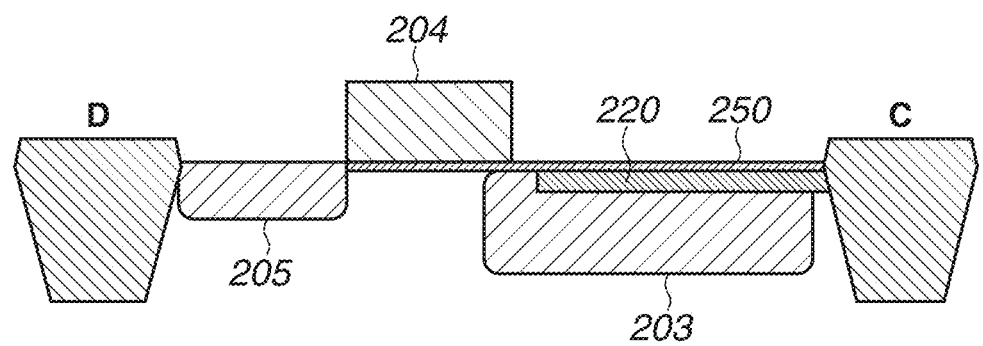
FIGS. 15A and 15B each schematically illustrate a cross-section configuration of the pixel of the imaging apparatus.
Figure 15B:
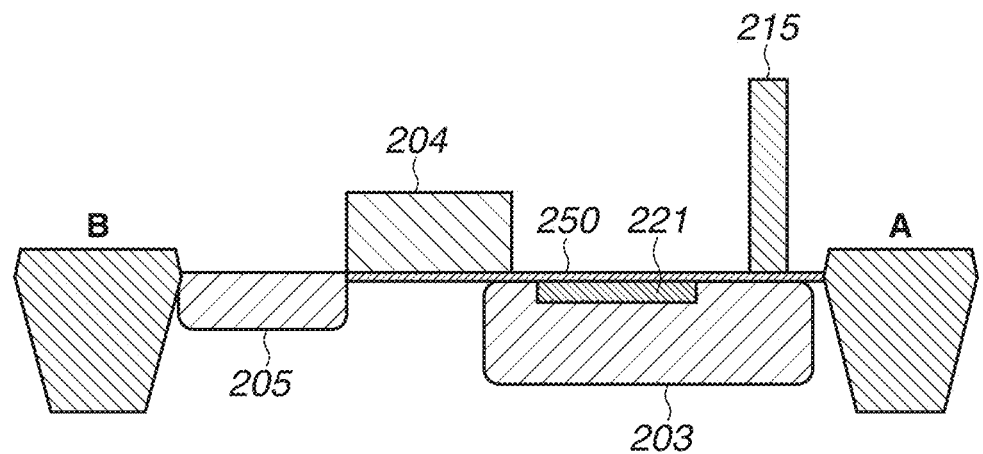

FIG. 15A schematically illustrates a cross-sectional configuration of the pixel taken along a line C-D illustrated in FIG. 14. FIG. 15B schematically illustrates a cross-sectional configuration of the pixel taken along a line A-B illustrated in FIG. 14.

First, the light-receiving pixel 305 (the cross-section corresponding to the line C-D) illustrated in FIG. 15A will be described. The semiconductor region 203 where the charges are accumulated is formed below the p-type semiconductor region 220. By this configuration, the p-type semiconductor region 220 functions as the surface protective layer that protects the surface of the semiconductor region 203. The p-type semiconductor region 220 is formed between a main surface 250 of a semiconductor substrate and the semiconductor region 203.

Next, the reference pixel 307 (the cross-section corresponding to the line A-B) illustrated in FIG. 15B will be described. The CNT 215 is connected to a partial region of the semiconductor region 203 where the charges are accumulated. The p-type semiconductor region 221 is not formed below this CNT 215. Further, the p-type semiconductor region 221 is provided between the portion of the semiconductor region 203 to which the CNT 215 is connected, and the transfer gate 204. Further, regarding a portion where the p-type semiconductor region 221 and the semiconductor region 203 overlap each other in the planar view, the semiconductor region 203 is provided below the p-type semiconductor region 221. The p-type semiconductor region 221 is formed between the main surface 250 of the semiconductor substrate and the semiconductor region 203.

In the case where the conductivity type of the semiconductor region 203 is the n-type, a conductivity type of the semiconductor region 221 is the p-type. Therefore, the p-type semiconductor region 221 has a lower potential than the semiconductor region 203A. In other words, a potential of the p-type semiconductor region 221 is set to a potential between a potential of the transfer gate 204 when the transfer gate 204 is turned off and a potential of the semiconductor region 203. If the p-type semiconductor region 221 is not formed, an electric field corresponding to a potential difference between the transfer gate 204 and the semiconductor region 203 is applied to the transfer gate 204. On the other hand, in the present exemplary embodiment, the provision of the p-type semiconductor region 221 allows the electric field applied to the transfer gate 204 to reduce to an electric field corresponding to a potential difference between the transfer gate 204 and the p-type semiconductor region 221. This reduction can make a failure less likely to occur in the transfer transistor 402 in the reference pixel 307. In other words, according to the pixel configuration of the present exemplary embodiment, a failure in the reference pixel 307 can become less likely to occur.

A semiconductor region having the same conductivity type as the semiconductor region 203 and a higher impurity concentration than the semiconductor region 203 may be provided between the semiconductor region 203 and the CNT 215. According to such a configuration, connection resistance can be reduced.

Figure 3:
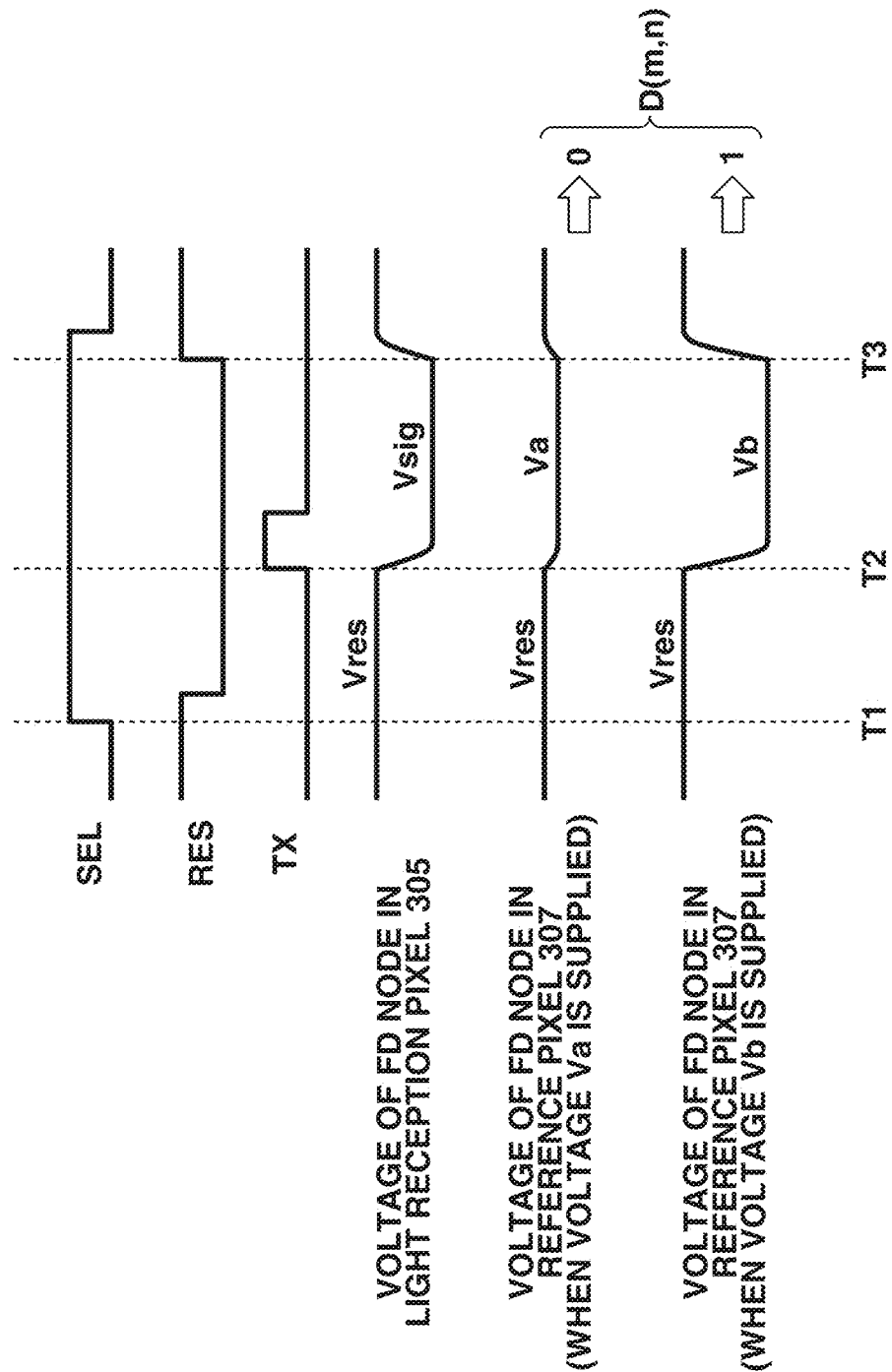
FIG. 3 is a timing chart schematically illustrating an operation of the pixel of the imaging apparatus.

Next, an operation of each of the light-receiving pixel 305, the OB pixel 306, and the reference pixel 307 will be described. FIG. 3 is a timing chart of the driving signal SEL, the driving signal RES, and the driving signal TX. When the driving signal is at the high level, the corresponding transistor is turned on. When the driving signal is at the low level, the corresponding transistor is turned off. FIG. 3 further indicates the voltage of the FD node.

At time T1, the selection transistor 405 is turned on. At this time, the reset transistor 403 is turned on. Therefore, the voltage of the FD node is the reset voltage Vres. After the selection transistor 405 is turned on, the reset transistor 403 is turned off. The amplification transistor 404 outputs a pixel signal (a noise signal) at a level corresponding to the reset voltage Vres to the output line 308.

At time T2, the transfer transistor 402 is turned on. The charges in the PD 401 are transferred to the FD node in each of the light-receiving pixel 305 and the OB pixel 306. The voltage of the FD node changes from the reset voltage Vres to a signal voltage Vsig. The amplification transistor 404 outputs a pixel signal at a level corresponding to a voltage Vsig to the output line 308.

In the reference pixel 307, when the transfer transistor 402 is turned on, the voltage Va or the voltage Vb output from the output control circuit 304 is supplied to the FD node. In the case where the voltage Va is supplied, the voltage of the FD node changes from the reset voltage Vres to the voltage Va. In the case where the voltage Vb is supplied, the voltage of the FD node changes from the reset voltage Vres to the voltage Vb. The amplification transistor 404 outputs the pixel signal at the level corresponding to the voltage Va or the voltage Vb to the output line 308. The pixel signal output from the reference pixel 307 forms the address signal.

At time T3, the reset transistor 403 is turned on, and the selection transistor 405 is subsequently turned off. As a result, an operation of reading out the pixel signal from each of the plurality of pixels 305, 306, and 307 contained in one row is ended.

The column circuit 302 performs subtraction processing on the pixel signal with use of the noise signal output at the time of the reset. By this processing, the pixel signal with the noise reduced therefrom can be acquired. The column circuit 302 further performs processing such as the retention of the pixel signal and the conversion from the analog signal to the digital signal as necessary.

In the present exemplary embodiment, the light-receiving pixel 305, the OB pixel 306, and the reference pixel 307 contained in the same row are connected to the common driving control line 309. Therefore, the pixel signal is read out from the reference pixel 307 in parallel with the pixel signal being read out from each of the light-receiving pixel 305 and the OB pixel 306. As described above, the pixel signal from the reference pixel 307 forms the address signal indicating the row to which the reference pixel 307 belongs. Therefore, by such a configuration, it can be determined whether the pixel signal is normally output from the specified row. The light-receiving pixel 305, the OB pixel 306, and the reference pixel 307 contained in the same row may be connected to electrically separated individual driving control lines, respectively. The connection of the light-receiving pixel 305, the OB pixel 306, and the reference pixel 307 in the same row to the common driving control line 309 is one example of the configuration that reads out these pixel signals in parallel.

The address signal formed by the pixel signal output from the reference pixel 307 will be described in detail. A digital signal is used as the address signal according to the present exemplary embodiment. In other words, the pixel signal of the reference pixel 307 corresponds to a signal value in each bit in the digital signal. As illustrated in FIG. 3, the pixel signal at the level corresponding to the voltage Va indicates "0", and the pixel signal at the level corresponding to the voltage Vb indicates "1". A symbol D(m, n) is added to the pixel signal to allow the pixel signals to be distinguished from each other or one another. In this symbol, m represents a row number and n represents a column number.

FIG. 4 schematically illustrates the signal value of the address signal according to the present exemplary embodiment. FIG. 4 illustrates the pixel signals of the reference pixels 307 as many as 16 rows×12 columns by way of example. However, the number of the reference pixels 307 is not limited thereto.

Twelve reference pixels 307 are contained in one row. In other words, in the present exemplary embodiment, the address signal is expressed as a 12-bit digital signal. The address signal formed by the pixel signals from the reference pixels 307 in one row includes three sets of sub signals having the same signal value. For example, the reference pixels 307 at column numbers 0 to 3 in the first row output a sub signal having a signal value "0001". The reference pixels 307 at column numbers 4 to 7 in the first row output a sub signal having the same signal value "0001". Then, the reference pixels 307 at column numbers 8 to 11 in the first row output a sub signal having the same signal value "0001".

Further, the address signal has a different signal value for each row. For example, the sub signal of the address signal for the first row has the signal value "0001". The sub signal of the address signal for the second row has a signal value "0010". "0001" and "0010" are different signal values.

Figure 5:
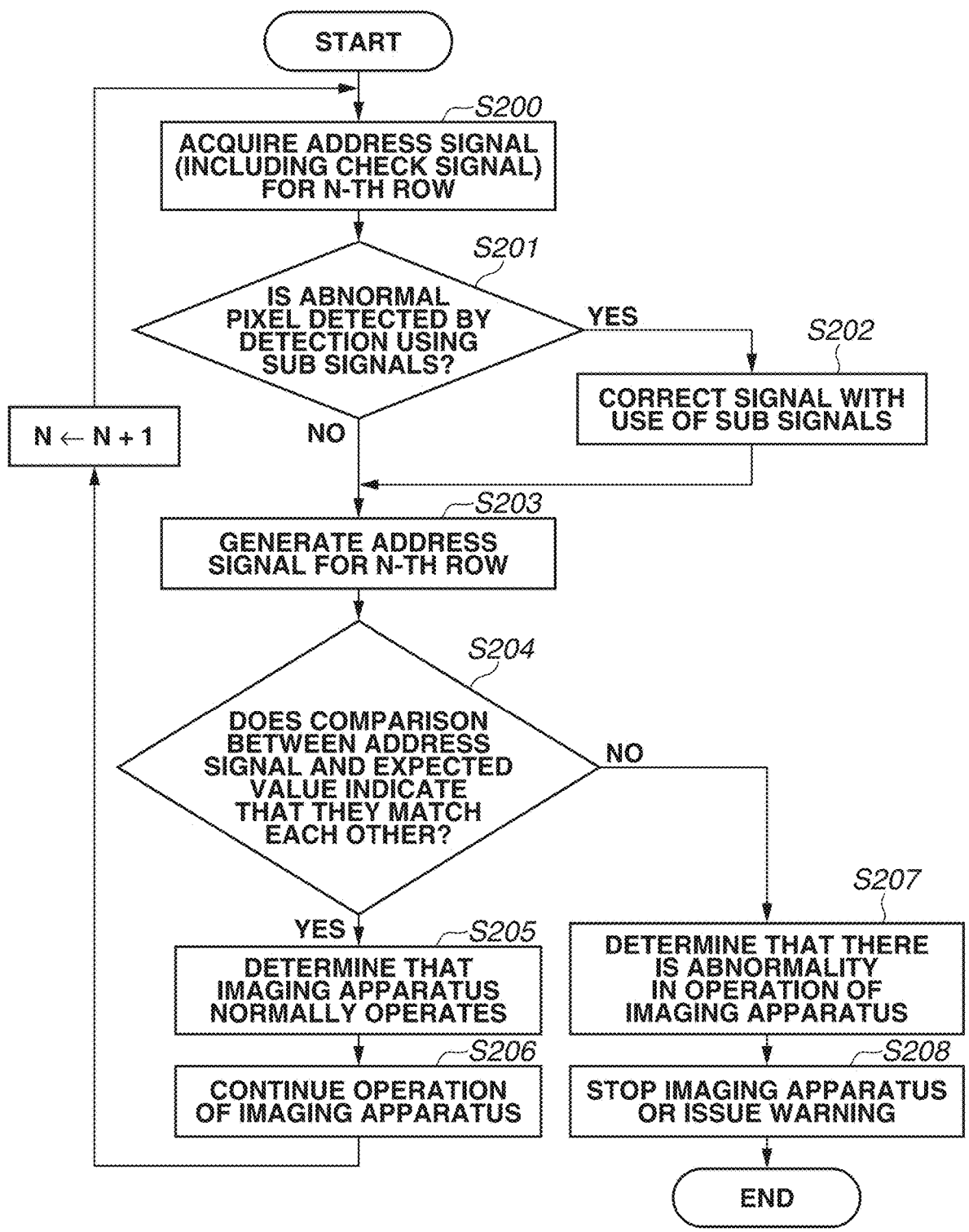
FIG. 5 is a flowchart illustrating a method for determining an operation of the imaging apparatus.

Subsequently, a method for determining whether the imaging apparatus normally outputs the pixel signal based on the address signal will be described. FIG. 5 is a flowchart for determining an operation of the imaging apparatus. This determination processing is performed by, for example, a signal processing unit provided outside the imaging apparatus. Alternatively, this determination processing is performed by a signal processing circuit provided inside the imaging apparatus.

In step S200, the signal processing unit or circuit acquires the address signal for an N-th row. The address signal includes the three sets of sub signals as described above.

In step S201, the signal processing unit or circuit determines whether the signal values of the three sets of sub signals match one another. In a case where the signal values of all the three sets of sub signals match one another, the signal processing unit or circuit determines that there is no abnormality in the reference pixel 307 (NO in step S201). In this case, the processing proceeds to the next step, step S203. In a case where any one of the three sets of sub signals has a different signal value from the other signal values, the signal processing unit or circuit determines that there is an abnormality in a part of the reference pixels 307 (YES in step S201). In this case, the processing proceeds to step S202.

In step S202, the signal processing unit or circuit employs the signal value of the sub signals in a majority as the address signal indicating this row. In other words, in step S202, the signal processing unit or circuit makes the determination by a majority vote with use of the three sub signals. For example, in a case where the signal values of the three sub signals are "0001", "0001", and "0101", respectively, the signal processing unit or circuit employs "0001" as the signal value of the address signal indicating the N-th row.

In step S203, the signal processing unit or circuit generates the address signal having the signal value acquired in the previous step as the address signal indicating the N-th row. In a case where all the signal values of the three sets of sub signals match one another (NO in step S201), the address signal having this matching signal value is generated. In a case where any one of the sub signals has the different signal value from the other signal values (YES in step S201), the address signal having the signal value selected by the majority vote in step S202 is generated.

In step S204, the signal processing unit or circuit compares the generated address signal with an expected value of the address signal for the N-th row. In a case where the signal value of the address signal matches the expected value (YES in step S204), the processing proceeds to step S205. In step S205, the signal processing unit or circuit determines that the imaging apparatus normally operates. Then, the processing proceeds to an operation of reading out an N+1-th row.

In a case where the signal value of the address signal does not match the expected value in step S204 (NO in step S204), the processing proceeds to step S207. In step S207, the signal processing unit or circuit determines that there is an abnormality in the operation of the imaging apparatus. In other words, the signal processing unit or circuit determines that a failure has occurred in the imaging apparatus. In this case, in step S208, the signal processing unit or circuit stops the operation of the imaging apparatus or issues a warning indicating that the failure has occurred in the imaging apparatus.

In the above-described manner, in the present exemplary embodiment, the pixel signals output from the reference pixels 307 form the address signal indicating the position of the row to which the reference pixels 307 belong. By such a configuration, it can be determined whether the pixel signal is normally output from the specified row. As a result, a failure in the imaging apparatus can be correctly detected.

Further, in the present exemplary embodiment, one address signal includes the three sets of sub signals having the same signal value as one another. By such a configuration, the presence or absence of a failure in the imaging apparatus can be correctly determined even when an abnormality has occurred in a part of the reference pixels 307. In other words, the plurality of reference pixels 307 contained in one row functions as a detection unit configured to detect an abnormality in the reference pixel as a whole.

The address signal for each row has been cited as an example in the above description, but the operation of the imaging apparatus may be determined with use of the address signal for each column. In this case, the present exemplary embodiment can be realized by replacing the term "row" with the term "column" in the present disclosure.

A second exemplary embodiment will be described. The structure of the address signal is different to that in the first exemplary embodiment. Therefore, in the following description, the second exemplary embodiment will be described, mainly focusing on differences from the first exemplary embodiment and omitting descriptions of similar features to the first exemplary embodiment.

Figure 6A:
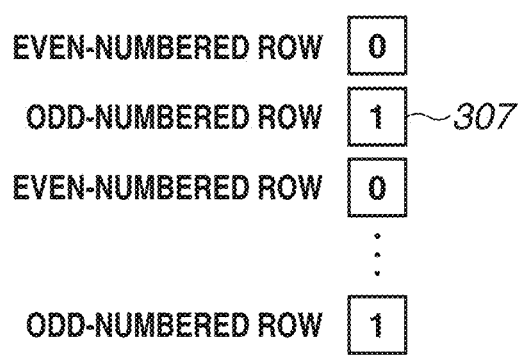
FIGS. 6A, 6B, and 6C each schematically illustrate an address signal output from an imaging apparatus.
Figure 6B:
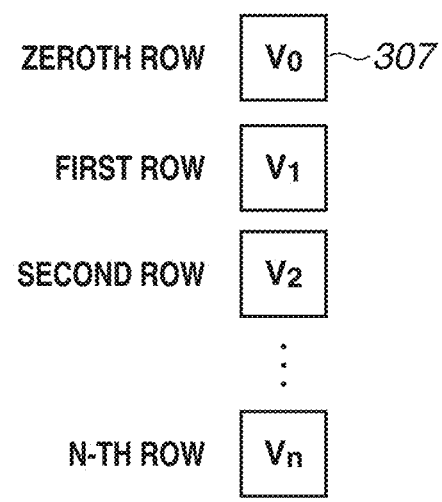
Figure 6C:
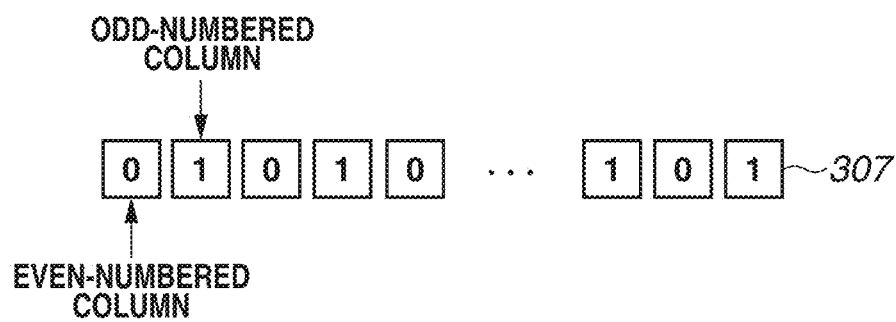

FIGS. 6A, 6B, and 6C each schematically illustrate a signal value of the address signal according to the present exemplary embodiment. In an imaging apparatus illustrated in FIG. 6A, each row contains one reference pixel 307. The reference pixel 307 outputs a pixel signal indicating whether the row to which the reference pixel 307 belongs is an even-numbered row or an odd-numbered row. For example, the reference pixel 307 in the even-numbered row outputs a pixel signal at a level indicating "0". The reference pixel 307 in the odd-numbered row outputs a pixel signal at a level indicating "1". The other configuration is similar to the first exemplary embodiment, and therefore a description thereof will be omitted here.

By such a configuration, it can be determined whether the signal is output from the imaging apparatus in a correct order. For example, when an operation of outputting the pixel signals from all the rows in order is performed, the signal value of the output address signal changes alternately between "0" and "1". It can be determined that the imaging apparatus correctly outputs the pixel signal by detecting this change in the address signal.

FIG. 6B illustrates another exemplary embodiment. In an imaging apparatus illustrated in FIG. 6B, the reference pixel 307 outputs a pixel signal at a level unique to the row to which the reference pixel 307 belongs. Then, the level of the pixel signal output from the reference pixel 307 indicates the signal value of the address signal. In other words, the address signal according to the present exemplary embodiment is an analog signal. More specifically, the reference pixel 307 in the zeroth row outputs a pixel signal at a level corresponding to a voltage V0. Similarly, the reference pixel 307 in an n-th row outputs a pixel signal at a level corresponding to a voltage Vn. Each of voltages from the voltage V0 to the voltage Vn has a different value from the other voltages.

By such a configuration, it can be determined whether the pixel signal of the specified row is appropriately output. For example, when the pixel signal is read out from each of the light-receiving pixel 305 and the OB pixel 306 in the second row, it is determined whether the signal value of address signal (which is based on the pixel signal output from the reference pixel 307) matches a signal value assigned to the second row (e.g. the signal value that was expected to be generated based on pixel value setting(s) that were applied to the reference pixel(s) of the second row), in particular, a voltage V2 in the present example. If they do not match each other, the pixel signal may fail to be read out from each of the light-receiving pixel 305 and the OB pixel 306 in the second row, whereby it can be determined that a failure has occurred in the imaging apparatus.

FIG. 6C illustrates yet another exemplary embodiment. In an imaging apparatus illustrated in FIG. 6C, one reference pixel 307 is disposed in one column. The reference pixel 307 outputs a pixel signal indicating whether the column to which the reference pixel 307 belongs is an even-numbered column or an odd-numbered column. The other configuration is similar to the content described with reference to FIG. 6A. Further, the imaging apparatus may be configured in such a manner that the reference pixel 307 in each column outputs a pixel signal at a level different from each other or one another, like FIG. 6B.

In the above-described manner, according to the present exemplary embodiment, the pixel signal output from the reference pixel 307 forms the address signal indicating the position of the row or the column to which the reference pixel 307 belongs. By such a configuration, it can be determined whether the pixel signal is normally output from the specified row or column. As a result, a failure in the imaging apparatus can be correctly detected.

Further, in the present exemplary embodiment, one row contains only one reference pixel 307 or one column contains only one reference pixel 307. Therefore, the number of reference pixels 307 can be reduced, which allows the imaging apparatus to be reduced in size.

The present exemplary embodiment does not include the detection unit configured to detect an abnormality in the reference pixel 307. Therefore, step S201 and step S202 in the flowchart illustrated in FIG. 5 are not performed. The pixel signal output from the reference pixel 307 is directly used as the address signal. As an exemplary modification of the present exemplary embodiment, the detection unit configured to detect an abnormality in the reference pixel 307 may be added, like the first exemplary embodiment.

A third exemplary embodiment will be described. The structure of the address signal is different to that in the first exemplary embodiment. Therefore, in the following description, the third exemplary embodiment will be described, mainly focusing on differences from the first exemplary embodiment and omitting descriptions of similar features to the first exemplary embodiment.

A configuration of the imaging apparatus according to the present exemplary embodiment is similar to the first exemplary embodiment. In other words, FIG. 1 schematically illustrates the configuration of the imaging apparatus according to the third exemplary embodiment. A detailed description thereof will be omitted here.

A configuration and an operation of each of the light-receiving pixel 305, the OB pixel 306, and the reference pixel 307 according to the present exemplary embodiment are similar to the first exemplary embodiment. In other words, FIGS. 2A and 2B each illustrate an equivalent circuit of each of the light-receiving pixel 305, the OB pixel 306, and the reference pixel 307 according to the present exemplary embodiment. The configuration of each of the light-receiving pixel 305 and the reference pixel 307 is illustrated in FIGS. 13 to 15A and 15B. Further, FIG. 3 is a timing chart of driving signals used in the imaging apparatus according to the present exemplary embodiment. Detailed descriptions thereof will be omitted here.

In the present exemplary embodiment, the light-receiving pixel 305, the OB pixel 306, and the reference pixel 307 contained in the same row are connected to the common driving control line 309. Therefore, the pixel signal is read out from the reference pixel 307 in parallel with the pixel signal being read out from each of the light-receiving pixel 305 and the OB pixel 306. The pixel signal from the reference pixel 307 forms the address signal indicating the row to which the reference pixel 307 belongs. Therefore, by such a configuration, it can be determined whether the pixel signal is normally output from the specified row. The light-receiving pixel 305, the OB pixel 306, and the reference pixel 307 contained in the same row may be connected to electrically separated individual driving control lines, respectively. The connection of the light-receiving pixel 305, the OB pixel 306, and the reference pixel 307 in the same row to the common driving control line 309 is one example of the configuration that reads out these pixel signals in parallel.

The address signal formed by the pixel signal output from the reference pixel 307 will be described in detail. A digital signal is used as the address signal according to the present exemplary embodiment. In other words, the pixel signal of the reference pixel 307 corresponds to a signal value in each bit in the digital signal. As illustrated in FIG. 3, the pixel signal at the level corresponding to the voltage Va indicates "0", and the pixel signal at the level corresponding to the voltage Vb indicates "1". The symbol D(m, n) is added to the pixel signal to allow the pixel signals to be distinguished from each other or one another. In this symbol, m represents the row number and n represents the column number.

Figure 7:
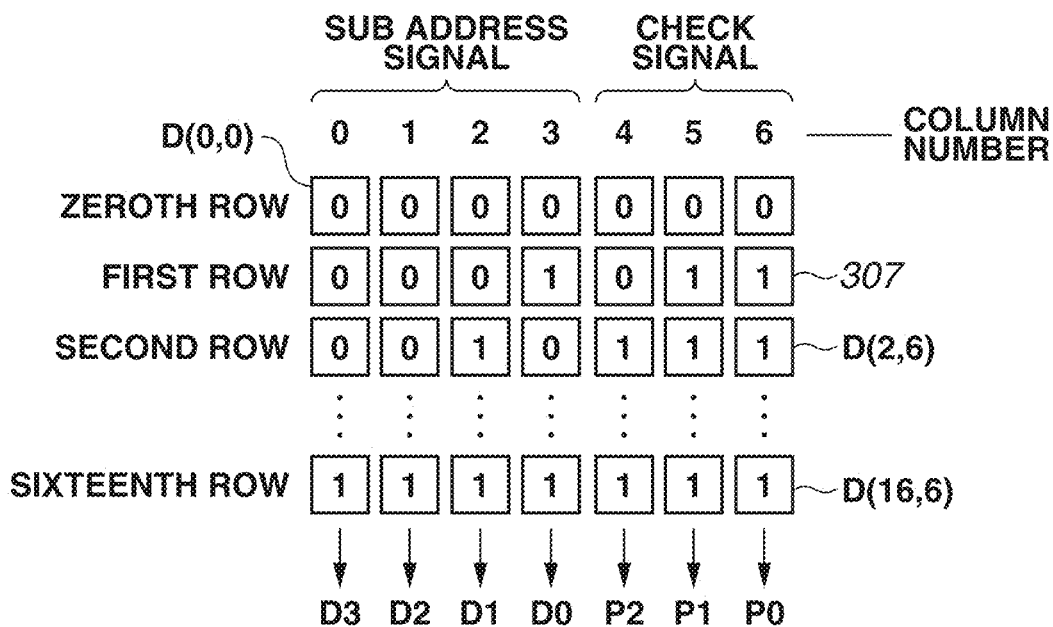
FIG. 7 schematically illustrates an address signal output from an imaging apparatus.

FIG. 7 schematically illustrates the signal value of the address signal according to the present exemplary embodiment. FIG. 7 illustrates the pixel signals of the reference pixels 307 as many as 16 rows×7 columns by way of example. However, the number of the reference pixels 307 is not limited thereto.

Seven reference pixels 307 are contained in one row. In other words, in the present exemplary embodiment, the address signal is expressed as a 7-bit digital signal. The address signal formed by the pixel signals from the reference pixels 307 in one row includes a sub address signal indicating the positon of the row to which the reference pixels 307 belong, and a check signal. The pixel signals output from the reference pixels 307 at column numbers 0 to 3 in each row form the sub address signal. The pixel signals output from the reference pixels 307 at column numbers 4 to in each row form the check signal. The check signal contains information for correcting an error in the address signal. The check signal according to the present exemplary embodiment is set by calculating a Hamming coding operation on the sub address signal. In other words, a Hamming code is used in the address signal according to the present exemplary embodiment. As an example other than this example, the check signal may be generated as a parity bit.

The Hamming coding operation will be described. In the present exemplary embodiment, the sub address signal is a 4-bit digital signal. D0 to D3 will be used to represent the 4 bits forming the sub address signal, respectively. The check signal is a 3-bit digital signal. P0 to P2 will be used to represent the 3 bits forming the check signal, respectively. The signal value in each of the bits of the check signal can be acquired by calculating operations indicated by the following equations (1) to (3).

$$P2 = D3 + D2 + D1 \quad (1)$$

$$P1 = D3 + D1 + D0 \quad (2)$$

$$P0 = D2 + D1 + D0 \quad (3)$$

In each of the equations (1) to (3), "+" means execution of an exclusive-OR (EXOR) logical operation. If the two logical values are different from each other, an operation result is "1". If the two logical values are equal to each other, the operation result is "0".

The sub address signal in the zeroth row has a signal value "0000". Therefore, the check signal in the zeroth row has a signal value "000". The sub address signal in the first row has a signal value "0001". Therefore, the check signal in the first row has a signal value "011". The sub address signal in the second row has a signal value "0010". Therefore, the check signal in the second row has a signal value "111". For the other rows, the signal value of the check signal is also set in a similar manner. In the present exemplary embodiment, the address signal has a different value for each row.

Figure 8:
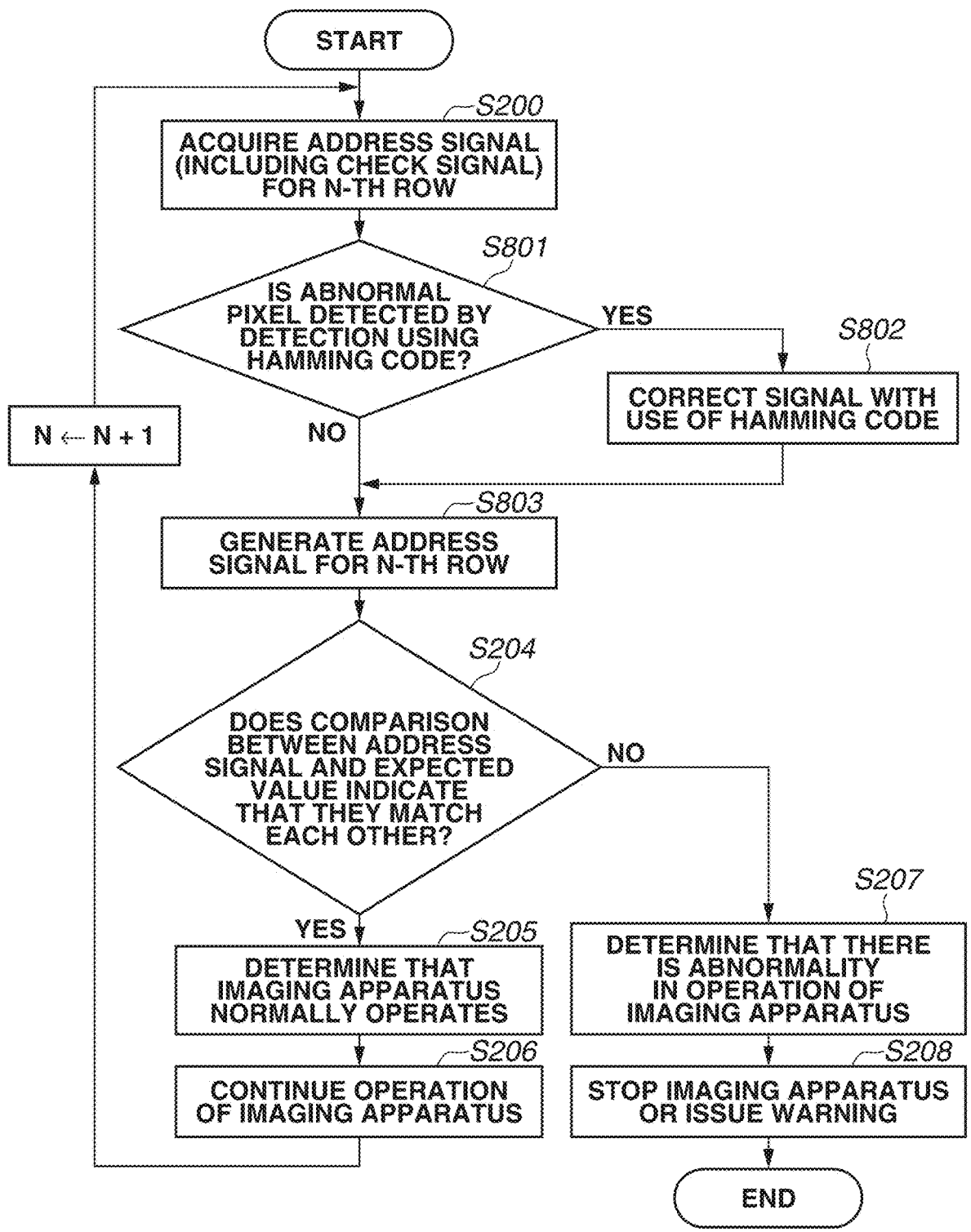
FIG. 8 is a flowchart illustrating a method for determining an operation of the imaging apparatus.

Subsequently, a method for determining whether the imaging apparatus normally outputs the pixel signal based on the address signal will be described. FIG. 8 is a flowchart for determining an operation of the imaging apparatus. Steps in which similar operations to FIG. 5 are performed are indicated by the same step numbers as FIG. 5. This determination processing is performed by, for example, the signal processing unit provided outside the imaging apparatus. Alternatively, this determination processing is performed by the signal processing circuit provided inside the imaging apparatus.

In step S200, the signal processing unit or circuit acquires the address signal for the N-th row. The address signal includes the sub address signal and the check signal as descried above.

In step S801, the signal processing unit or circuit determines whether an abnormality has occurred in the reference pixel 307 with use of the address signal coded according to the Hamming coding. More specifically, the signal processing unit or circuit performs decoding processing on the address signal. By this processing, it can be determined which bit the abnormality has occurred in among the bits of the address signal. A known technique for decoding the Hamming code is used for the decoding processing.

In a case where an abnormality in the reference pixel 307 is detected in step S801 (YES in step S801), in step S802, the signal processing unit or circuit corrects the signal value of the address signal. More specifically, the signal processing unit or circuit inverts the signal value in the bit corresponding to the reference pixel 307 determined to have the abnormality therein. After that, the processing proceeds to step S803. In a case where no abnormality in the reference pixel 307 is detected in step S801 (NO in step S801), the processing directly proceeds to step S803.

In step S803, the signal processing unit or circuit generates the address signal having the signal value acquired in the previous step as the address signal indicating the N-th row. In a case where there is no abnormality in the reference pixel 307 (NO in step S801), the address signal having the signal value of the sub address signal is generated. In a case where there is an abnormality in the reference pixel 307 (YES in step S801), the address signal having the signal value of the sub address signal corrected in step S802 is generated.

A subsequent operation is similar to the first exemplary embodiment. In step S204, the signal processing unit or circuit compares the generated address signal with the expected value of the address signal for the N-th row. In a case where the signal value of the address signal matches the expected value (YES in step S204), the processing proceeds to step S205. In step S205, the signal processing unit or circuit determines that the imaging apparatus normally operates. Then, the processing proceeds to the operation of reading out the N+1-th row.

In a case where the signal value of the address signal does not match the expected value in step S204 (NO in step S204), the processing proceeds to step S207. In step S207, the signal processing unit or circuit determines that there is an abnormality in the operation of the imaging apparatus. In other words, the signal processing unit or circuit determines that a failure has occurred in the imaging apparatus. In this case, in step S208, the signal processing unit or circuit stops the operation of the imaging apparatus or issues the warning indicating that the failure has occurred in the imaging apparatus.

In the above-described manner, in the present exemplary embodiment, the pixel signals output from the reference pixels 307 form the address signal indicating the position of the row to which the reference pixels 307 belong. By such a configuration, it can be determined whether the pixel signal is normally output from the specified row. As a result, a failure in the imaging apparatus can be correctly detected.

Further, in the present exemplary embodiment, the address signal includes the check signal calculated based on the Hamming coding operation. By such a configuration, the presence or absence of a failure in the imaging apparatus can be correctly determined even when an abnormality has occurred in a part of the reference pixels 307. In other words, the reference pixels 307 that output the pixel signals forming the check signal function as the detection unit configured to detect an abnormality in the reference pixel.

The address signal for each row has been cited as an example in the above description, but the operation of the imaging apparatus may be determined with use of the address signal for each column. In this case, the present exemplary embodiment can be realized by replacing the term "row" with the term "column" in the present disclosure.

A fourth exemplary embodiment will be described. An imaging apparatus according to the present exemplary embodiment is different from the first exemplary embodiment in terms of a configuration in which one reference pixel outputs a plurality of pixel signals at levels different from each other or one another. Further, the fourth exemplary embodiment is also different from the first exemplary embodiment in terms of the method for detecting an abnormality in the reference pixel 307. Therefore, in the following description, the fourth exemplary embodiment will be described, mainly focusing on differences from the first exemplary embodiment and omitting descriptions of similar features to the first exemplary embodiment as appropriate.

A configuration of the imaging apparatus according to the present exemplary embodiment is similar to the first exemplary embodiment. In other words, FIG. 1 schematically illustrates the configuration of the imaging apparatus according to the fourth exemplary embodiment. A detailed description thereof will be omitted here.

A configuration and an operation of each of the light-receiving pixel 305, the OB pixel 306, and the reference pixel 307 according to the present exemplary embodiment are similar to the first exemplary embodiment. In other words, FIGS. 2A and 2B each illustrate an equivalent circuit of each of the light-receiving pixel 305, the OB pixel 306, and the reference pixel 307 according to the present exemplary embodiment. The configuration of each of the light-receiving pixel 305 and the reference pixel 307 is illustrated in FIGS. 13 to 15A and 15B. Further, FIG. 3 is a timing chart of driving signals used in the imaging apparatus according to the present exemplary embodiment. Detailed descriptions thereof will be omitted here.

The reference pixel 307 according to the first exemplary embodiment is configured to selectively output the pixel signal at the level corresponding to the voltage Va and the pixel signal at the level corresponding to the voltage Vb, based on the control by the output control circuit 304. However, in the first exemplary embodiment, one reference pixel 307 does not necessarily have to output the two pixel signals at the different levels. On the other hand, the reference pixel 307 according to the present exemplary embodiment outputs both the pixel signal at the level corresponding to the voltage Va and the pixel signal at the level corresponding to the voltage Vb, based on the control by the output control circuit 304. The presence or absence of an abnormality in the reference pixel 307 can be determined by determining whether the level of the pixel signal output from the reference pixel 307 changes as expected.

In the present exemplary embodiment, the light-receiving pixel 305, the OB pixel 306, and the reference pixel 307 contained in the same row are connected to the common driving control line 309. Therefore, the pixel signal is read out from the reference pixel 307 in parallel with the pixel signal being read out from each of the light-receiving pixel 305 and the OB pixel 306. As described above, the pixel signal from the reference pixel 307 forms the address signal indicating the row to which the reference pixel 307 belongs. Therefore, by such a configuration, it can be determined whether the pixel signal is normally output from the specified row. The light-receiving pixel 305, the OB pixel 306, and the reference pixel 307 contained in the same row may be connected to electrically separated individual driving control lines, respectively. The connection of the light-receiving pixel 305, the OB pixel 306, and the reference pixel 307 in the same row to the common driving control line 309 is one example of the configuration that reads out these pixel signals in parallel.

The address signal formed by the pixel signal output from the reference pixel 307 will be described in detail. A digital signal is used as the address signal according to the present exemplary embodiment. In other words, the pixel signal of the reference pixel 307 corresponds to a signal value in each bit in the digital signal. As illustrated in FIG. 3, the pixel signal at the level corresponding to the voltage Va indicates "0", and the pixel signal at the level corresponding to the voltage Vb indicates "1". The symbol D(m, n) is added to the pixel signal to allow the pixel signals to be distinguished from each other or one another. In this symbol, m represents the row number and n represents the column number.

Figure 9:
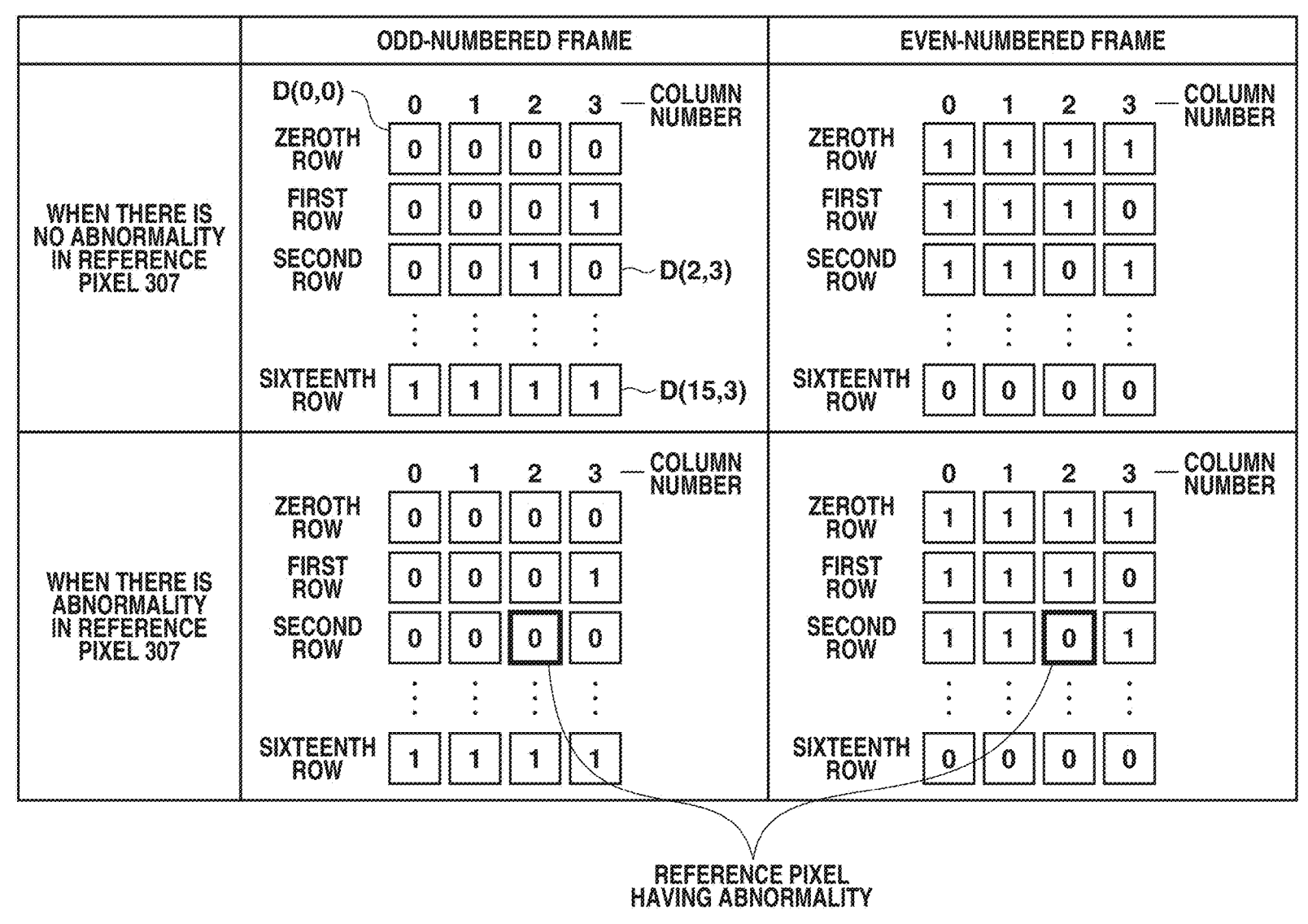

FIG. 9 schematically illustrates the signal value of the address signal according to the present exemplary embodiment. FIG. 9 illustrates the pixel signals of the reference pixels 307 as many as 16 rows×4 columns by way of example. However, the number of the reference pixels 307 is not limited thereto. Four reference pixels 307 are contained in one row. In other words, in the present exemplary embodiment, the address signal is expressed as a 4-bit digital signal.

FIG. 9 illustrates an example in which the address signal for each row has a different signal value according to an operation state of the imaging apparatus. More specifically, the address signal in an odd-numbered frame and the address signal in an even-numbered frame have signal values inverted from each other. For example, the address signal for the second row has a signal value "0010" in the odd-numbered frame. On the other hand, the address signal for the second row has a signal value "1101" in the even-numbered frame. Similarly, as illustrated in FIG. 9, the signal value in each of the bits of the address signal is inverted between the odd-numbered frame and the even-numbered frame. The output control circuit 304 switches the voltage to be supplied to the reference pixel 307 between the voltage Va and the voltage Vb for each frame, thereby allowing the signal value in each of the bits of the address signal to be inverted.

Now, when there is an abnormality in the reference pixel 307, the level of the pixel signal output from this reference pixel 307 does not change. FIG. 9 illustrates an example in which there is an abnormality in the reference pixel 307 at the column number 2 in the second row. The address signal for the second row has a signal value "0000" in the odd-numbered frame. On the other hand, the address signal for the second row has a signal value "1101" in the even-numbered frame. A signal value D(2, 2) is not inverted in this manner, so that the presence of the abnormality in the reference pixel 307 at the column number 2 in the second row can be detected.

Figure 10:
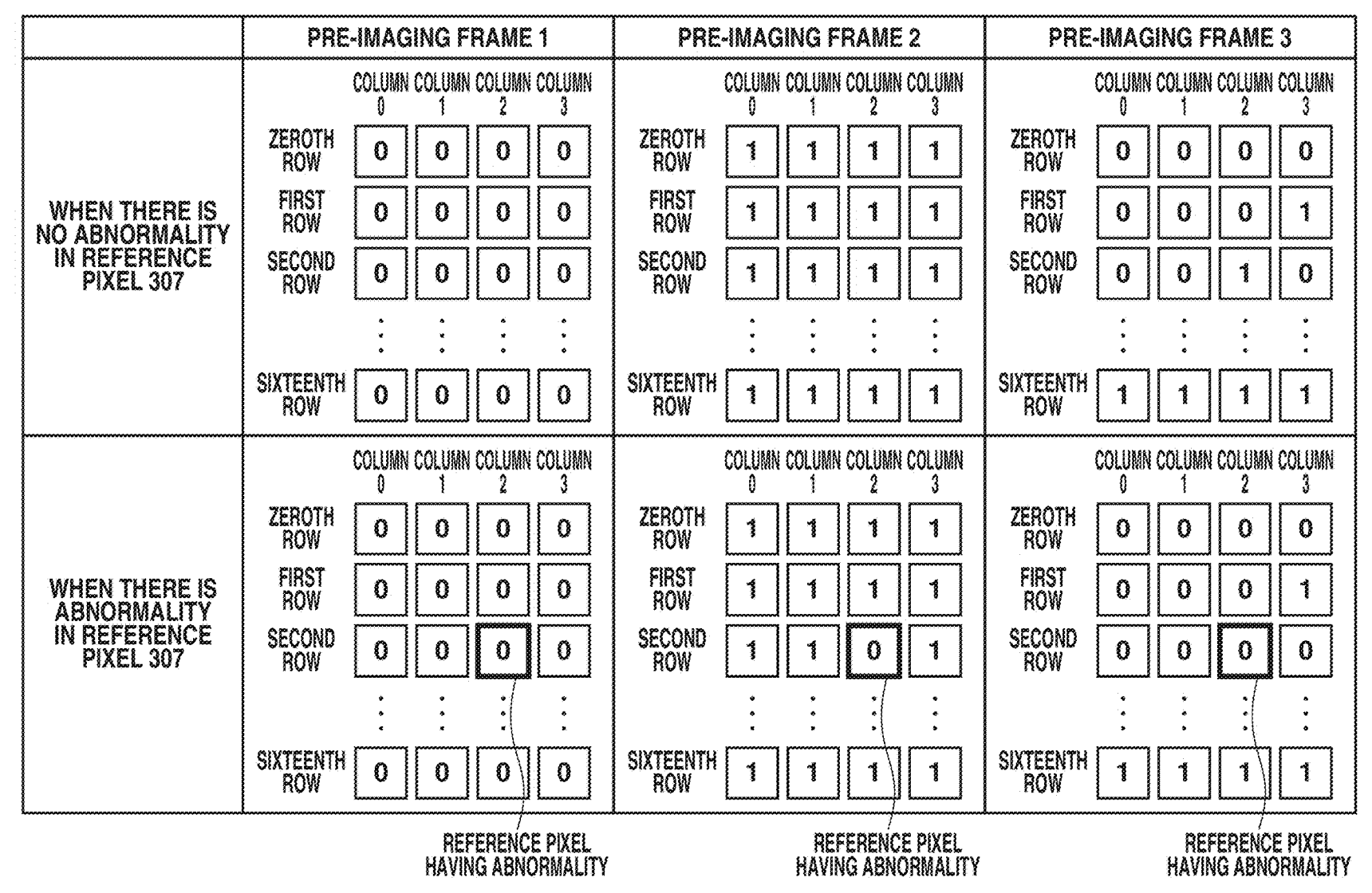

Another example of how the signal value of the address signal changes will be described. FIG. 10 schematically illustrates the signal value of the address signal according to the present exemplary embodiment. FIG. 10 illustrates the pixel signals of the reference pixels 307 as many as 16 rows×4 columns by way of example. However, the number of reference pixels 307 is not limited thereto. Four reference pixels 307 are contained in one row. In other words, in the present exemplary embodiment, the address signal is expressed as a 4-bit digital signal.

In the example illustrated in FIG. 10, the signal value of the address signal formed by the pixel signals output from the same reference pixels 307 is different between a period during which the imaging is carried out and a period other than that. Then, the operation of reading out the pixel signal of the reference pixel 307 is performed before the pixel signal is output from each of the light-receiving pixel 305 and the OB pixel 306 or before imaging corresponding to one frame is carried out. First, the output control circuit 304 supplies the voltage Va corresponding to the signal value "0" to all the reference pixels 307. In this state, the pixel signals of the reference pixels 307 are read out. This readout operation will be referred to as an operation of reading out a pre-imaging frame 1. Next, the output control circuit 304 supplies the voltage Vb corresponding to the signal value "1" to all the reference pixels 307. In this state, the pixel signals of the reference pixels 307 are read out. This readout operation will be referred to as an operation of reading out a pre-imaging frame 2. If there is no abnormality in the reference pixel 307, all the pixel signals output from the individual reference pixels 307 alternately indicate "0" and "1".

Then, if there is an abnormality in the reference pixel 307, the level of the pixel signal output from this reference pixel 307 does not change. FIG. 10 illustrates an example in which there is an abnormality in the reference pixel 307 at the column number 2 in the second row. It can be noticed that, when the above-described operation of reading out the pre-imaging frame 1 and operation of reading out the pre-imaging frame 2 are performed, the signal value D(2, 2) is not inverted as illustrated in FIG. 10. In other words, the presence of the abnormality in the reference pixel 307 at the column number 2 in the second row can be detected.

After that, when the imaging is carried out, the output control circuit 304 selects any of the voltage Va and the voltage Vb to supply it to the reference pixels 307 in such a manner that the address signal for each row has the signal value unique to the row to which the address signal belongs.

In this manner, according to the imaging apparatus of the present exemplary embodiment, an abnormality in the reference pixel 307 can be detected by the method illustrated in FIG. 9 or 10. Then, it is possible, for example, to refrain from comparing (i.e. not to compare) the address signal and the expected value (contrary to the step S204 illustrated in FIGS. 5 and 8) when the address signal including the pixel signal of the reference pixel 307 having the abnormality therein is received. This processing can reduce a possibility of incorrectly determining that a failure has occurred in the imaging apparatus. In other words, in the present exemplary embodiment, the output control circuit 304 functions as the detection unit configured to detect an abnormality in the reference pixel.

Figure 11:
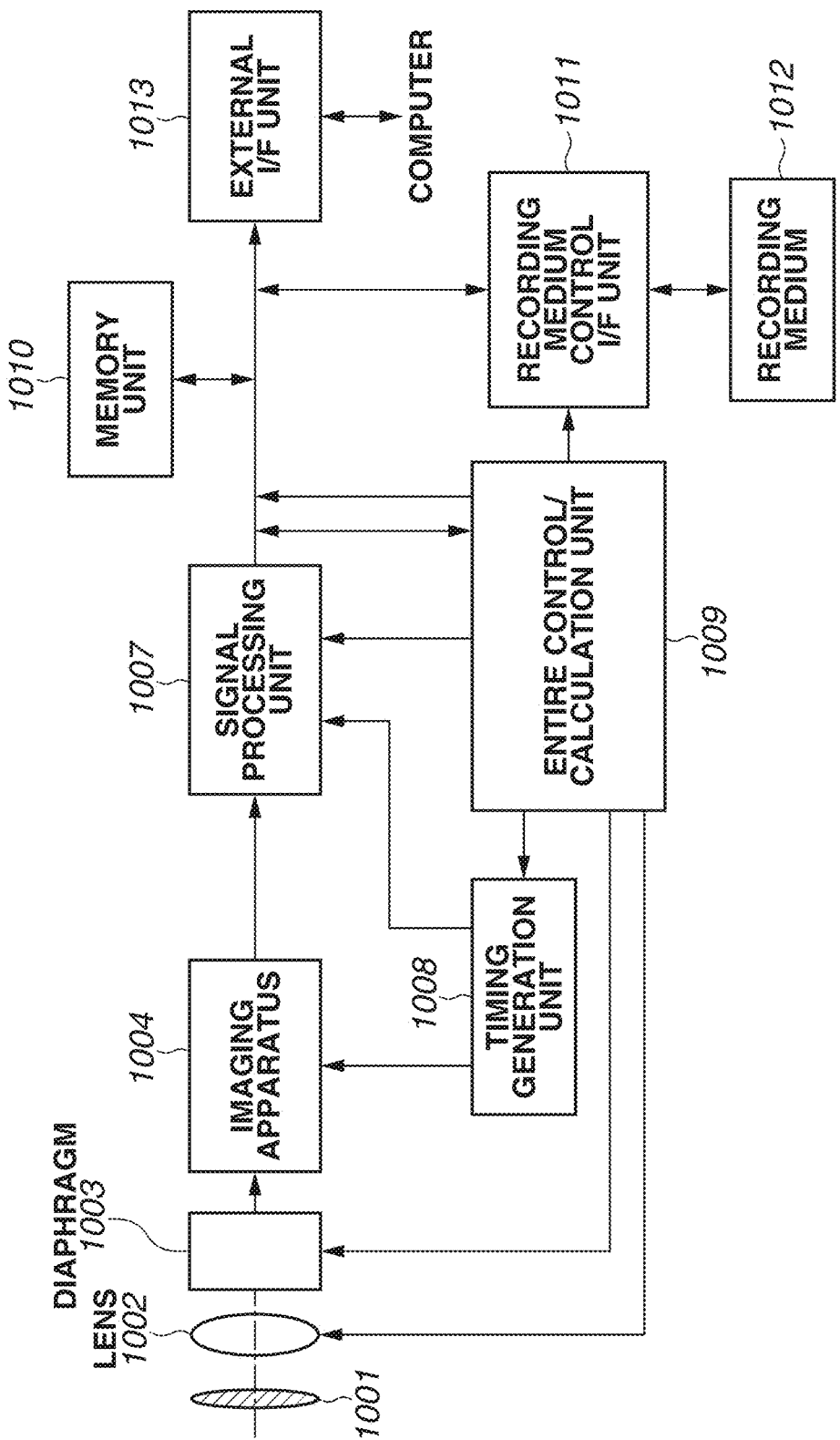
FIG. 11 is a block diagram illustrating an exemplary embodiment of an imaging system.

In a fifth exemplary embodiment, an imaging system will be described. Examples of the imaging system include a digital still camera, a digital camcorder, a camera head, a copying machine, a facsimile machine, a mobile phone, an in-vehicle camera, and an observatory satellite. FIG. 11 illustrates a block diagram of the digital still camera as an example of the imaging system.

In FIG. 11, a barrier 1001 functions to protect a lens. A lens 1002 allows an optical image of a subject to be formed on an imaging apparatus 1004. A diaphragm 1003 functions to vary a light amount transmitted through the lens 1002. The imaging apparatus described in any of the above-described individual exemplary embodiments is used as the imaging apparatus 1004.

A signal processing unit 1007 performs processing, such as a correction and a data compression, on a pixel signal output from the imaging apparatus 1004 to acquire an image signal. Then, in FIG. 11, a timing generation unit 1008 outputs various kinds of timing signals to the imaging apparatus 1004 and the signal processing unit 1007, and an entire control unit 1009 controls the entire digital still camera. A frame memory unit 1010 functions to temporarily store image data. A recording medium control interface unit 1011 functions to record or read data into or out of a recording medium. A detachably attachable recording medium 1012, such as a semiconductor memory, functions to record or read imaging data therein or therefrom. An interface unit 1013 functions to communicate with an external computer and the like.

The imaging system only has to include at least the imaging apparatus 1004, and the signal processing unit 1007 that processes the pixel signal output from the imaging apparatus 1004. In this case, the other configuration is disposed outside the imaging system.

In the present exemplary embodiment, the signal processing unit 1007 determines whether the pixel signal is normally output from the imaging apparatus 1004. Therefore, the signal processing unit 1007 receives a plurality of address signals output from the imaging apparatus 1004. The address signals output from the imaging apparatus 1004 are similar to the address signal described in any of the above-described individual exemplary embodiments. Further, a method by which the signal processing unit 1007 determines an operation of the imaging apparatus 1004 is similar to the method illustrated in FIG. 5 or 8 and described in the description of this flowchart. In other words, the descriptions of the first to fourth exemplary embodiments are entirely incorporated in the present exemplary embodiment.

Further, the signal processing unit 1007 may determine whether there is an abnormality in the reference pixel 307 included in the imaging apparatus 1004, based on the address signal. More specifically, as illustrated in FIG. 5, the signal processing unit 1007 compares the signal values of the three sub signals included in each of the address signals, and then determines the operation of the imaging apparatus 1004 based on the two or more sub signals having the signal values matching each other or one another.

Alternatively, as illustrated in FIG. 8, the signal processing unit 1007 corrects the address signal with use of the check signal included in each of the address signals. Then, the signal processing unit 1007 determines the operation of the imaging apparatus 1004 based on the sub address signal included in the address signal after the correction. The sub signal and the check signal are similar to those described in the third exemplary embodiment.

The signal processing unit 1007 does not necessarily have to detect whether there is an abnormality in the pixel. For example, in the case where the imaging apparatus according to the second exemplary embodiment is used, the signal processing unit 1007 does not detect whether there is an abnormality in the pixel.

In the above-described manner, in the exemplary embodiment of the imaging system, the imaging apparatus according to any of the first to fourth exemplary embodiments is used as the imaging apparatus 1004. According to such a configuration, a failure in the imaging apparatus 1004 can be correctly detected.

Figure 12A:
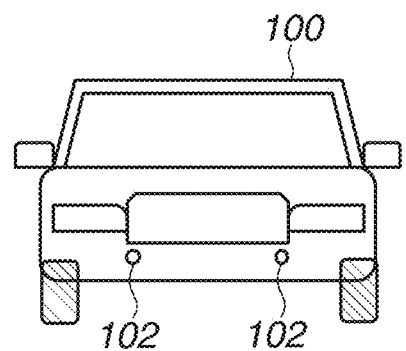
FIGS. 12A and 12B are each a block diagram illustrating an exemplary embodiment of a moving object.
Figure 12A:
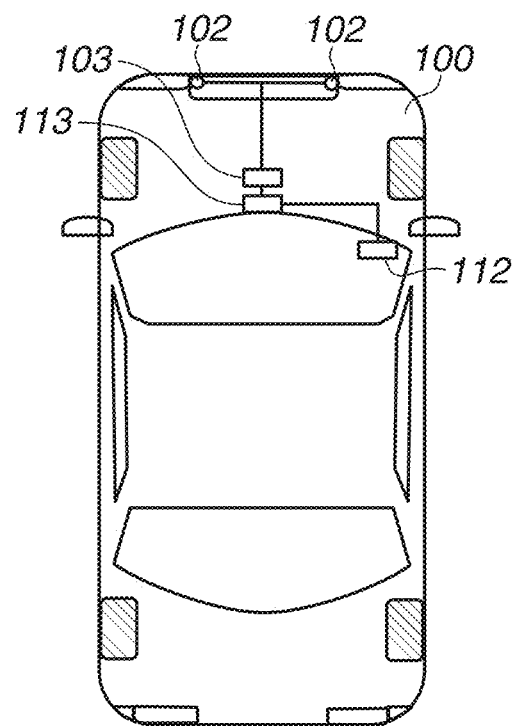
Figure 12A:
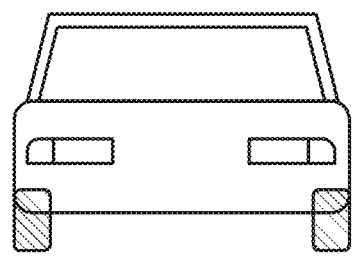

In a sixth exemplary embodiment, a moving object will be described. The moving object according to the present exemplary embodiment is an automobile equipped with an in-vehicle camera. FIG. 12A schematically illustrates an external appearance and a main internal configuration of an automobile 100. The automobile 100 includes imaging apparatuses 102, an imaging system integrated circuit, in particular, an application specific integrated circuit (ASIC) 103, a warning apparatus 112, and a main control unit 113.

Any of the imaging apparatuses described in the above-described first to fourth exemplary embodiments is used as each of the imaging apparatuses 102. The warning apparatus 112 issues a warning to a driver when receiving a signal indicating an abnormality from an imaging system, vehicle sensors, control units, or the like. The main control unit 113 comprehensively controls operations of the imaging system, the vehicle sensors, the control units, and the like. The automobile 100 does not have to include the main control unit 113. In this case, the imaging system, the vehicle sensors, and the control units include respective individual communication interfaces, and each transmit and receive a control signal via a communication network (for example, the Controller Area Network (CAN) standard).

Figure 12B:
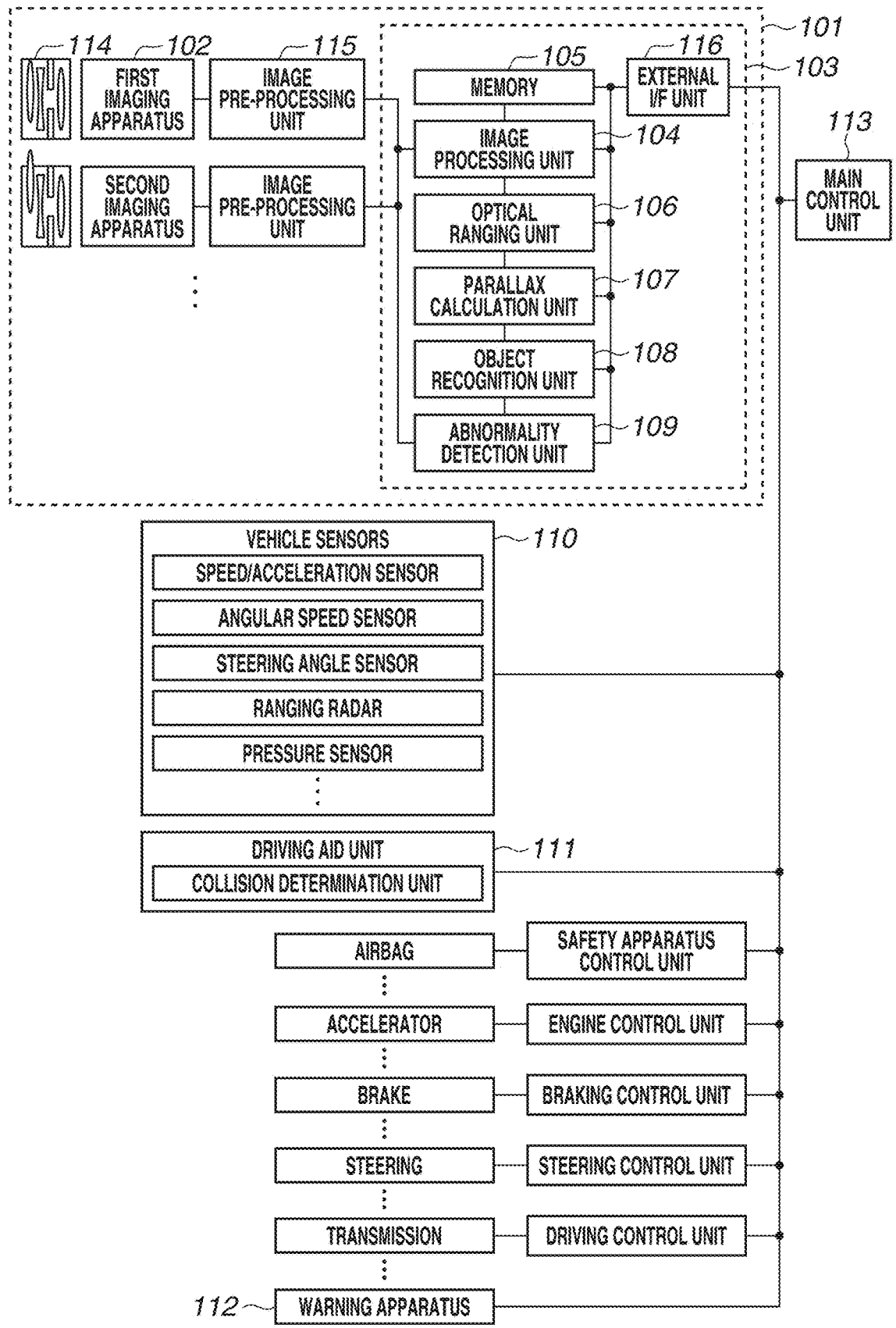

FIG. 12B is a block diagram illustrating a system configuration of the automobile 100. The automobile 100 includes a first imaging apparatus 102 and a second imaging apparatus 102. In other words, the in-vehicle camera according to the present exemplary embodiment is a stereo camera. An image of a subject is formed on each of the imaging apparatuses 102 by an optical unit 114. The pixel signal output from each of the imaging apparatuses 102 is processed by an image pre-processing unit 115, and is then transmitted to the imaging system integrated circuit 103. The image pre-processing unit 115 performs processing such as a signal-noise (S-N) calculation and an addition of a synchronization signal.

The imaging system integrated circuit 103 includes an image processing unit 104, a memory 105, an optical ranging unit 106, a parallax calculation unit 107, an object recognition unit 108, an abnormality detection unit 109, and an external interface (I/F) unit 116. The image processing unit 104 processes the pixel signal to generate an image signal. Further, the image processing unit 104 corrects the image signal and complements an abnormal pixel. The memory 105 temporarily stores the image signal therein. Further, the memory 105 may store therein a position of a known abnormal pixel in the imaging apparatuses 102. The optical ranging unit 106 focuses the imaging apparatuses 102 on the subject or measures a distance to the subject with use of the image signal. The parallax calculation unit 107 carries out subject matching (stereo matching) between parallax images. The object recognition unit 108 analyzes the image signal to recognize the subject, such as an automobile, a human, a sign, and a road. The abnormality detection unit 109 detects a failure or a malfunction of each of the imaging apparatuses 102. The abnormality detection unit 109 transmits a signal indicating that an abnormality is detected to the main control unit 113 when detecting the failure or the malfunction. The external I/F unit 116 mediates supply and reception of information between each of the units in the imaging system integrated circuit 103 and, for example, the main control unit 113 or various control units.

The automobile 100 includes a vehicle information acquisition unit 110 and a driving aid unit 111. The vehicle information acquisition unit 110 includes vehicle sensors, such as a speed/acceleration sensor, an angular speed sensor, a steering angle sensor, a ranging radar, and a pressure sensor.

The driving aid unit 111 includes a collision determination unit. The collision determination unit determines whether the automobile 100 may collide with an object based on information from the optical ranging unit 106, the parallax calculation unit 107, and/or the object recognition unit 108. The optical ranging unit 106 and the parallax calculation unit 107 are one example of a distance information acquisition unit that acquires distance information to a target. In other words, the distance information refers to information regarding a parallax, a defocus amount, a distance to the target, and/or the like. The collision determination unit may determine a collision possibility with use of any of these pieces of distance information. The distance information acquisition unit may be realized by hardware designed specially therefor or may be realized by a software module.

The present exemplary embodiment has been described based on the example in which the driving aid unit 111 controls the automobile 100 so as to prevent the automobile 100 from colliding with another object, but can also be applied to control of automatically driving the automobile 100 so as to follow another vehicle, control of automatically driving the automobile 100 so as to prevent the automobile 100 from deviating from a traffic lane, and the like.

The automobile 100 further includes driving units to be used when the automobile 100 runs, such as an airbag, an accelerator, a brake, a steering, and a transmission. Further, the automobile 100 includes control units for them. The control units each control the corresponding driving unit, based on the control signal from the main control unit 113.

In the present exemplary embodiment, the abnormality detection unit 109 of the imaging system integrated circuit 103 determines whether the pixel signal is normally output from each of the imaging apparatuses 102. Therefore, the abnormality detection unit 109 receives a plurality of address signals output from each of the imaging apparatuses 102. The address signals output from each of the imaging apparatuses 102 are similar to the address signal described in any of the above-described individual exemplary embodiments. Further, a method by which the abnormality detection unit 109 determines an operation of each of the imaging apparatuses 102 is similar to the method illustrated in FIG. 5 or 8 and described in the description of this flowchart. In other words, the descriptions of the first to fourth exemplary embodiments are entirely incorporated in the present exemplary embodiment.

Further, the abnormality detection unit 109 may determine whether there is an abnormality in the reference pixel 307 included in each of the imaging apparatuses 102 based on the address signal. More specifically, as illustrated in FIG. 5, the abnormality detection unit 109 compares the signal values of the three sub signals included in each of the address signals, and then determines the operation of each of the imaging apparatuses 102 based on the two or more sub signals having the signal values matching each other or one another.

Alternatively, as illustrated in FIG. 8, the abnormality detection unit 109 corrects the address signal with use of the check signal included in each of the address signals. Then, the abnormality detection unit 109 determines the operation of each of the imaging apparatuses 102, based on the sub address signal included in the address signal after the correction. The sub signal and the check signal are similar to those described in the third exemplary embodiment.

The abnormality detection unit 109 does not necessarily have to detect whether there is an abnormality in the pixel. For example, in the case where the imaging apparatus according to the second exemplary embodiment is used, the abnormality detection unit 109 does not detect whether there is an abnormality in the pixel. Further, the detection of the failure and the detection of the reference pixel 307 having the abnormality therein may be carried out by the image pre-processing unit 115 and/or the image processing unit 104.

The imaging system used in the present exemplary embodiment can be applied to not only the automobile but also a moving object (a moving apparatus) such as a ship, an airplane, or an industrial robot. In addition, the imaging system used in the present exemplary embodiment can be applied to not only the moving object but also an apparatus widely using object recognition, such as an intelligent transportation system (ITS).

In the above-described manner, in the exemplary embodiment of the automobile, any of the imaging apparatuses according to the first to fourth exemplary embodiments is used as each of the imaging apparatuses 102. According to such a configuration, a failure in the imaging apparatus can be correctly detected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imaging apparatus comprising:
   a plurality of pixels including light receiving pixels and reference pixels, the light receiving pixels and the reference pixels being arranged in at least a first row and a second row, and the reference pixels each including a contact and a semiconductor region connected to the contact;
   a first voltage supply line and a second voltage supply line each extended across the first row and the second row;
   a voltage output circuit configured to output voltages including a first voltage and a second voltage, to the semiconductor region of at least one of the reference pixels via the contact and via the first voltage supply line and the second voltage supply line; and
   a selection unit configured to select one from a first state and a second state, the first state being where the voltage output circuit outputs the first voltage to the first voltage supply line and the second state being where the voltage output circuit does not output the first voltage to the first voltage supply line,
   wherein the light-receiving pixel or pixels being configured to receive incident light and output a pixel signal based on the incident light, and the reference pixel or pixels being configured to output at least a pixel signal based on one of the voltages output from the voltage output circuit,
   wherein a signal value of the pixel signal or pixel signals output from the reference pixel or the reference pixels in the first row and a signal value of the pixel signal or pixel signals output from the reference pixel or the reference pixels in the second row are different from each other,
   wherein the pixel signal output from at least one of the reference pixels of the first row is based on the first voltage, and
   wherein the pixel signal output from at least one of the reference pixels of the second row is based on the second voltage.

2. The imaging apparatus according to claim 1, wherein the voltage output circuit outputs the second voltage different from the first voltage to the plurality of pixels in the second state.

3. The imaging apparatus according to claim 2, wherein the pixel signal output from the reference pixel or the reference pixels of the second row is based on the second voltage.

4. The imaging apparatus according to claim 1, further comprising a detection unit configured to detect an abnormality in the reference pixel or the reference pixels.

5. The imaging apparatus according to claim 1, wherein the reference pixel or pixels are configured to output a plurality of pixel signals having different voltages.

6. The imaging apparatus according to claim 1, further comprising a control line connected to both the light-receiving pixel or pixels and the reference pixel or pixels located in the first row.

7. The imaging apparatus according to claim 1, further comprising a light-shielding film arranged to cover the reference pixel or pixels and expose the light-receiving pixels to incident light.

8. The imaging apparatus according to claim 1, wherein the reference pixel or pixels in the first row are arranged to provide the pixel signal in parallel with the pixel signal from the light-receiving pixel or pixels in the first row, and the reference pixel or pixels in the second row are arranged to provide the pixel signal in parallel with the pixel signal from the light-receiving pixel or pixels in the second row.

9. The imaging apparatus according to claim 1, wherein the reference pixel or pixels are arranged to provide a plurality of different pixel signals at different levels, and the imaging apparatus comprises a control circuit arranged to provide a control signal to the reference pixel or pixels for controlling the level of the pixel signal.

10. An imaging system comprising:
the imaging apparatus according to claim 1; and
a processing apparatus configured to process the pixel signal output from the light-receiving pixel or pixels of the imaging apparatus and provide an image signal based on the pixel signal.

11. A movable object comprising:
the imaging apparatus according to claim 1;
a processing apparatus configured to perform processing on the pixel signal output from the light-receiving pixel or pixels of the imaging apparatus; and
a control unit configured to control the movable object, based on a result of the processing.

12. The imaging apparatus of claim 1,
further comprising a transistor in the plurality of pixels,
wherein the first voltage and the second voltage outputted to a node connected to the transistor, and
wherein one of a source or a drain of the transistor is the node and the other is connected to a floating diffusion.

13. The imaging apparatus according to claim 1,
wherein each of the reference pixels are configured to output a pixel signal for forming an address signal indicating a position of the row to which the reference pixel belongs.

14. The imaging apparatus according to claim 13,
wherein the address signal includes at least three sub-signals having the same signal value, and each of the sub-signals includes a digital signal having a plurality of bits.

15. The imaging apparatus according to claim 13,
wherein the address signal includes a check signal based on a Hamming coding operation.

16. The imaging apparatus of claim 15, wherein the detection unit of the apparatus is arranged to determine whether there is an abnormal reference pixel based on the check signal.

17. The imaging apparatus of claim 15, wherein the detection unit of the apparatus is arranged to correct the signal values of the first address signal based on the check signal.

18. The imaging apparatus according to claim 13, wherein each of the first row and the second row outputs a plurality of the address signals having signal values different from each other.

19. The imaging apparatus according to claim 18, wherein the reference pixel is arranged, or the reference pixels are arranged, to change the pixel signal output in accordance with each frame of the imaging operation so that the signal value of the address signal changes in accordance with each frame of the imaging operation.

20. The imaging apparatus according to claim 18, wherein the signal value of the address signal within a first period during which the pixel signal of the light-receiving pixel or pixels is read out is different from the signal value of the address signal within a second period different from the first period.

21. The imaging apparatus of claim 13, further comprising a detection unit configured to detect an abnormality in the reference pixel or pixels,
wherein the address signal includes at least three sub-signals, and each of the sub-signals includes a digital signal having a plurality of bits, and
wherein the detection unit of the apparatus is arranged to:
compare the signal values in the three sub-signals of the address signal; and
determine whether there is an abnormal reference pixel based on one of the sub-signals being different to the other sub-signals.

* * * * *